United States Patent
Teig et al.

(10) Patent No.: US 6,854,101 B2
(45) Date of Patent: Feb. 8, 2005

(54) METHOD AND ARRANGEMENT FOR EXTRACTING CAPACITANCE IN INTEGRATED CIRCUITS HAVING NON MANHATTAN WIRING

(75) Inventors: Steven Teig, Menlo Park, CA (US); Arindam Chatterjee, San Carlos, CA (US)

(73) Assignee: Cadence Design Systems Inc., San Jose, CA (US)

(*) Notice: Subject to any disclaimer, the term of this patent is extended or adjusted under 35 U.S.C. 154(b) by 44 days.

(21) Appl. No.: 10/434,670

(22) Filed: May 9, 2003

(65) Prior Publication Data

US 2004/0049751 A1 Mar. 11, 2004

Related U.S. Application Data

(63) Continuation of application No. 09/681,830, filed on Jun. 13, 2001, now Pat. No. 6,581,198.

(51) Int. Cl.[7] .............................................. G06F 17/50
(52) U.S. Cl. .................................. 716/5; 716/6; 716/10
(58) Field of Search ............................ 715/5; 716/6, 10

(56) References Cited

U.S. PATENT DOCUMENTS

| | | |
|---|---|---|
| 4,300,196 A | 11/1981 | Lopresti |
| 4,839,823 A | 6/1989 | Matsumoto |
| 5,276,632 A | 1/1994 | Corwin et al. |
| 5,452,224 A | 9/1995 | Smith et al. |
| 5,642,296 A | 6/1997 | Saxena |
| 5,689,621 A | 11/1997 | Salam et al. |
| 5,808,919 A | 9/1998 | Preist et al. |
| 5,822,218 A | 10/1998 | Moosa et al. |
| 5,901,063 A | 5/1999 | Chang et al. |
| 5,903,469 A | 5/1999 | Ho |
| 6,018,623 A | 1/2000 | Chang et al. |
| 6,038,338 A | 3/2000 | Nguyen |
| 6,038,383 A | 3/2000 | Young et al. |
| 6,061,508 A | 5/2000 | Mehrotra et al. |
| 6,128,768 A | 10/2000 | Ho |
| 6,182,269 B1 | 1/2001 | Laubhan |
| 6,189,131 B1 | 2/2001 | Graef et al. |
| 6,209,123 B1 | 3/2001 | Maziasz et al. |
| 6,212,492 B1 | 4/2001 | Kuge |
| 6,243,653 B1 | 6/2001 | Findley |

(List continued on next page.)

OTHER PUBLICATIONS

U.S. Appl. No. 10/335,247, filed Dec. 31, 2002, Teig et al.
U.S. Appl. No. 10/335,097, filed Dec. 31, 2002, Teig et al.
U.S. Appl. No. 10/335,248, filed Dec. 31, 2002, Teig et al.

(List continued on next page.)

*Primary Examiner*—Matthew Smith
*Assistant Examiner*—Sun James Lin
(74) *Attorney, Agent, or Firm*—Stattler, Johansen & Adeli LLP

(57) ABSTRACT

The present invention introduces a method of quickly extracting the capacitance for interconnect wires in an integrated circuit routed with a non Manhattan architecture. To extract the capacitance a section containing non Manhattan wiring, the present invention proposes an approximation system that approximates the section of non Manhattan wiring with a Manhattan wiring section that has a capacitance per unit length that is generally proportional to the length of the approximated section. The capacitance effect from the approximated Manhattan wiring section may then be adjusted with a correction factor. Specifically, the present invention proposes that the capacitance be calculated for an interconnect wiring section by multiplying the length of the interconnect wiring section by an approximated capacitance per unit length value of a similar Manhattan wiring segment and adding a correction factor that corrects for the difference between the approximated Manhattan wiring section and the original non Manhattan wiring section.

19 Claims, 26 Drawing Sheets

U.S. PATENT DOCUMENTS

| | | | |
|---|---|---|---|
| 6,304,836 B1 | 10/2001 | Krivokapic et al. |
| 6,304,837 B1 | 10/2001 | Geiger et al. |
| 6,327,556 B1 | 12/2001 | Geiger et al. |
| 6,381,555 B1 | 4/2002 | Sewell |
| 6,414,498 B2 | 7/2002 | Chen |
| 6,430,729 B1 | 8/2002 | Dewey et al. |
| 6,446,027 B1 | 9/2002 | O Keefe et al. |
| 6,526,549 B1 | 2/2003 | You |
| 6,543,035 B2 | 4/2003 | Ohba et al. |
| 6,549,854 B1 | 4/2003 | Malinverno et al. |
| 6,581,195 B2 | 6/2003 | Tanaka |
| 6,581,198 B1 | 6/2003 | Teig et al. |
| 6,584,456 B1 | 6/2003 | Dom et al. |
| 6,587,997 B1 | 7/2003 | Chen et al. |
| 6,687,887 B1 | 2/2004 | Teig et al. |
| 6,735,748 B1 | 5/2004 | Teig et al. |
| 2002/0010691 A1 | 1/2002 | Chen |
| 2002/0056070 A1 | 5/2002 | Tanaka |
| 2002/0075383 A1 | 6/2002 | Trobaugh et al. |
| 2003/0065535 A1 | 4/2003 | Karlov et al. |
| 2003/0236760 A1 | 12/2003 | Nugent |
| 2004/0049751 A1 | 3/2004 | Teig et al. |

OTHER PUBLICATIONS

U.S. Appl. No. 10/335,095, filed Dec. 31, 2002, Teig et al.
U.S. Appl. No. 10/334,664, filed Dec. 31, 2002, Teig et al.
U.S. Appl. No. 10/062,264, filed Jan. 31, 2002, Teig et al.
U.S. Appl. No. 10/061,945, filed Jan. 31, 2002, Teig et al.
U.S. Appl. No. 10/062,184, filed Jan. 31, 2002, Teig et al.
U.S. Appl. No. 10/066,326, filed Jan. 31, 2002, Teig et al.
U.S. Appl. No. 10/062,193, filed Jan. 31, 2002, Teig et al.
U.S. Appl. No. 10/062,196, filed Jan. 31, 2002, Teig et al.
Brambilla, A. et al., Statistical Method for the Analysis of Interconnects Delay in Submicrometer Layouts, IEEE, Aug. 2001, pp. 957–966.
Brandt et al., Circuit Multi–fault Diagnosis and Prediction Error Estimation Using a Committee of Bayesian Neutral Networks, IEEE, Colloquium on Testing Mixed Signal Circuits and Systems, October 23, 1997, pp. 7/1–7/7.
Fertig, "Extracting Knowledge from Case Databases", Apr. 1991, IEEE Proceedings on Seventeenth Annual Northeast Bioengineering Conference, pp. 267–268.
Hung et al., Machine Learning in Engineering Design—an Unsupervised Fuzzy Neural Network Case–based Learning Model, Dec. 1997, IEEE Proceeding, Intelligent Information System, pp. 156–160.
Hunter, Knowledge Acquisition Planning for Inference from Large Databases, Jan. 1990, IEEE Proceeding of the 23th Annual Hawaii International Conference on System Sciences, vol. 2, pp. 35–44.
Ida et al., Bayesian Anaylsis in Manufacturing Instrumentation for Test and Evaluation, IEEE, Conference record of 1993 Fourth Fifth Annual Conference of Electrical Engineering Problems and Plastics Industries, Apr. 27, 1993, pp. 4–13.

Kolehmainen et al., A Bayesian Approach and Total Variation Priors in 3D Electrical Impedance Tomography, Proceedings of the 20th Annual International Conference of the IEEE Engineering in Medicine and Biology Society, vol. 2, Oct. 29, 1998, pp. 1028–1031.

Li et al., Monte Carlo Simulation Techniques for Probabilistic Tracking, IEEE, 2001, pp. 75–82.

Li et al., Pre–extracting Support Vectors for Support Vector Machine, Aug. 2000, IEEE Proceedings of 5th International Conference on Signal Processing, vol. 3, pp. 1432–1435.

Mani, N., A Neural Network Model for Partitioning in Floorplan Design, IEEE, pp. 1676–1680.

Niu et al., A Bayesian Approach to Variable screening for Modeling the IC Fabrication Process, 1995, IEEE International Symposium on Circuits and Systems, vol. 2, Apr. 30, 1995, pp. 1227–1230.

NN9107436, Maximum Likelihood Training of Probabilistic Linear Functions (Probabilistic Perceptrons), IBM Technical Disclosure Bulletin, vol. 34, No. 2, Jul. 1991. pp. 436–442.

Ruping, S., Incremental Learning with Support Vector Machines, Dec. 2001, IEEE Proceedings of Internal Conference on Data Mining, pp. 641–642.

Suykens, Nonlinear Modelling and Support Vector Machines, May 2001, IEEE Proceedings of the $18^{th}$ Instrumentation and Measurement Technology Conference, vol. 1, pp. 287–294.

Vehtari et al., Bayesian Neural networks for Industrial Applications, Proceedings of the 1999 IEEE Midnight–Sun Workshop on Soft Computing Methods in Industrial Applications, Jun. 16, 1999, pp. 63–68.

Wang et al., Accurate Parasitic Resistance Extraction for Interconnection Analysis, 1995, IEEE, Custom integrated circuits conference, 255–258.

Wright, W.A., Bayesian Approach to Neutral Network Modeling with Input Uncertainty, IEEE, Nov. 1999, pp. 1261–1270.

Yerramareddy et al., Creating and Using Models for Engineering Design A Machine–Learning Approach, Jun. 1992, IEEE Intelligent Systems, vol. 7, iss. 3, pp. 52–59.

Zhang et al., Confidence Regions for Cascaded Neural Network Prediction in Power Markets, 2001 Power Engineering Society Winter Meeting, vol. 2, Jan. 28, 2001, pp. 533–538.

Zhang, C.X. et al., Floorplan Design Using a Hierarchical Neutral Learning Algorithm, IEEE, Jun. 1991.pp. 2060–2063.

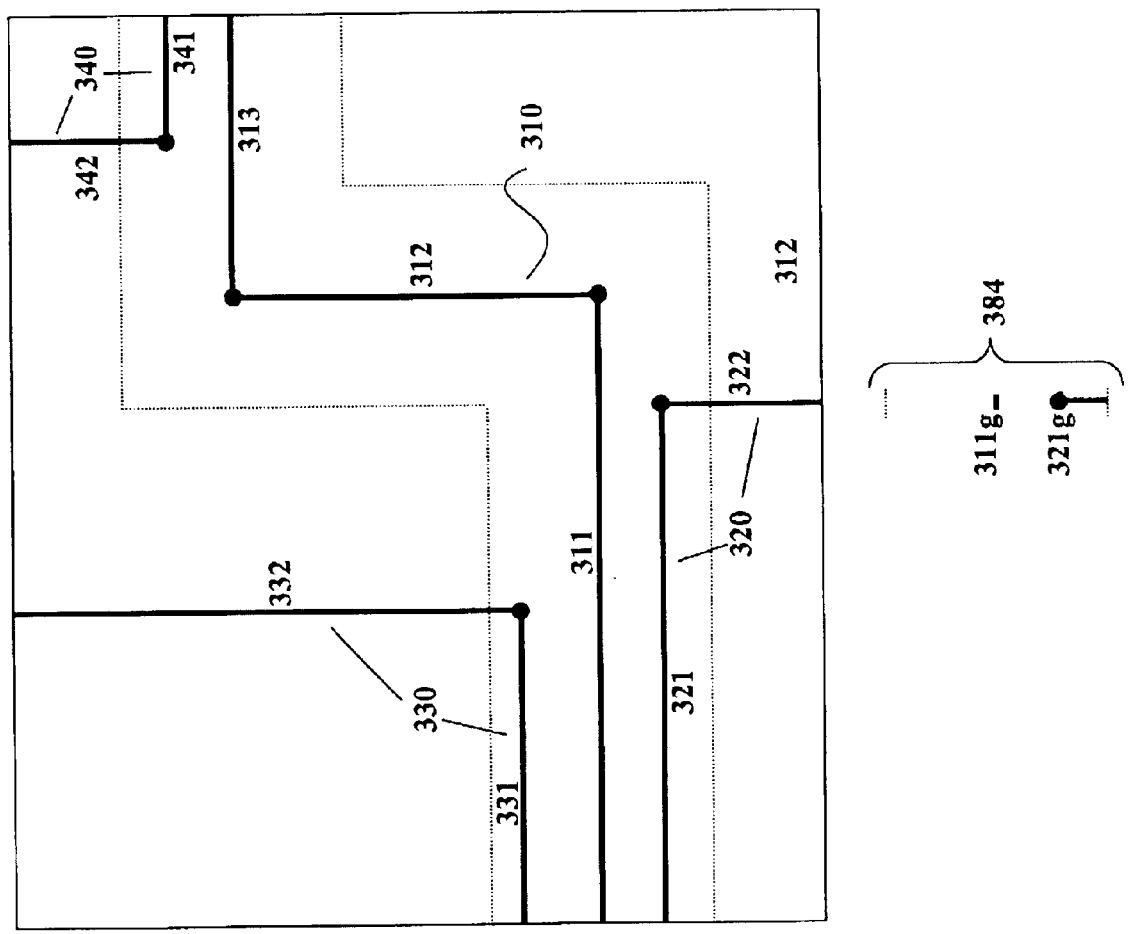

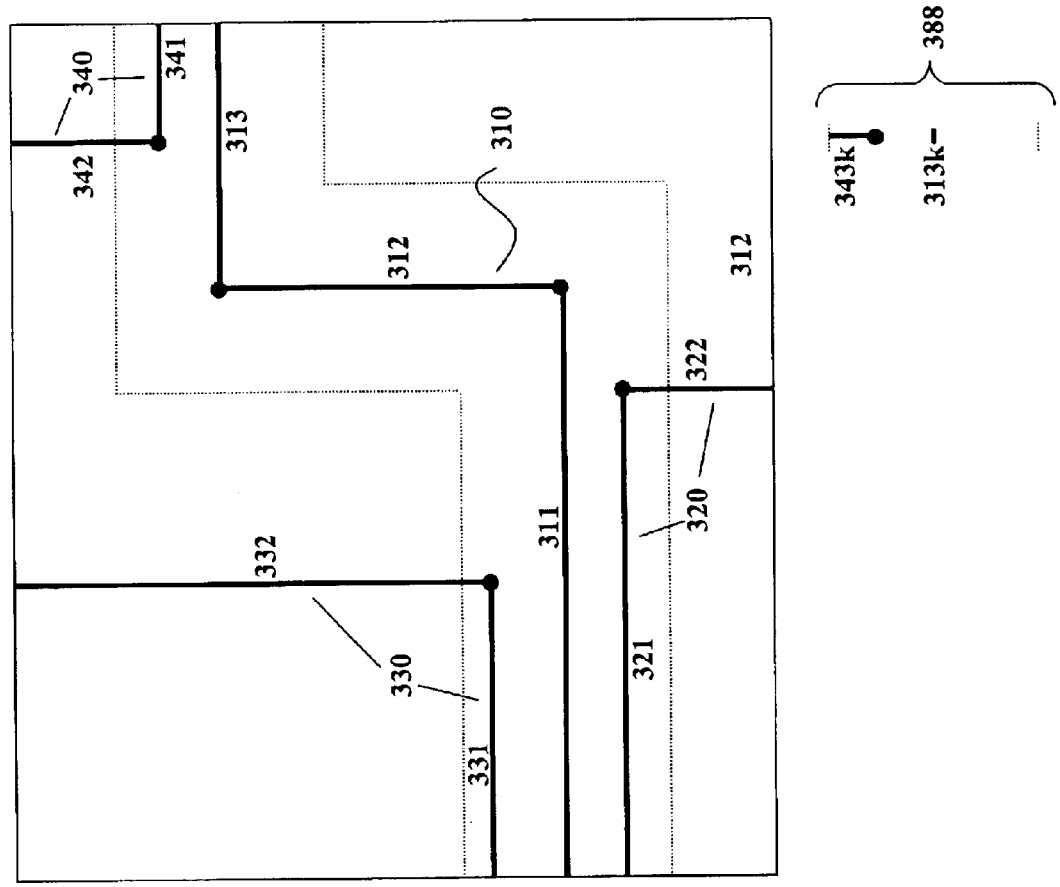

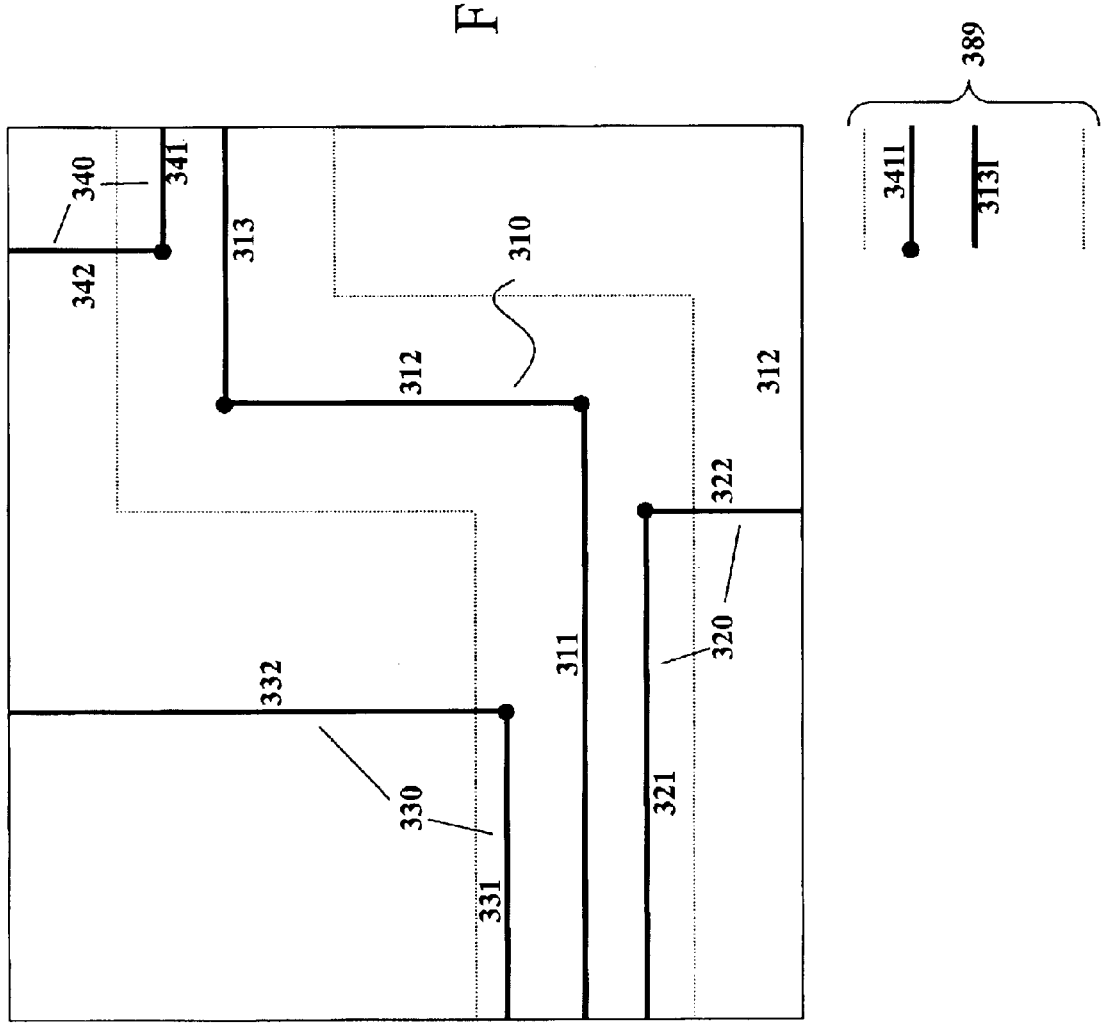

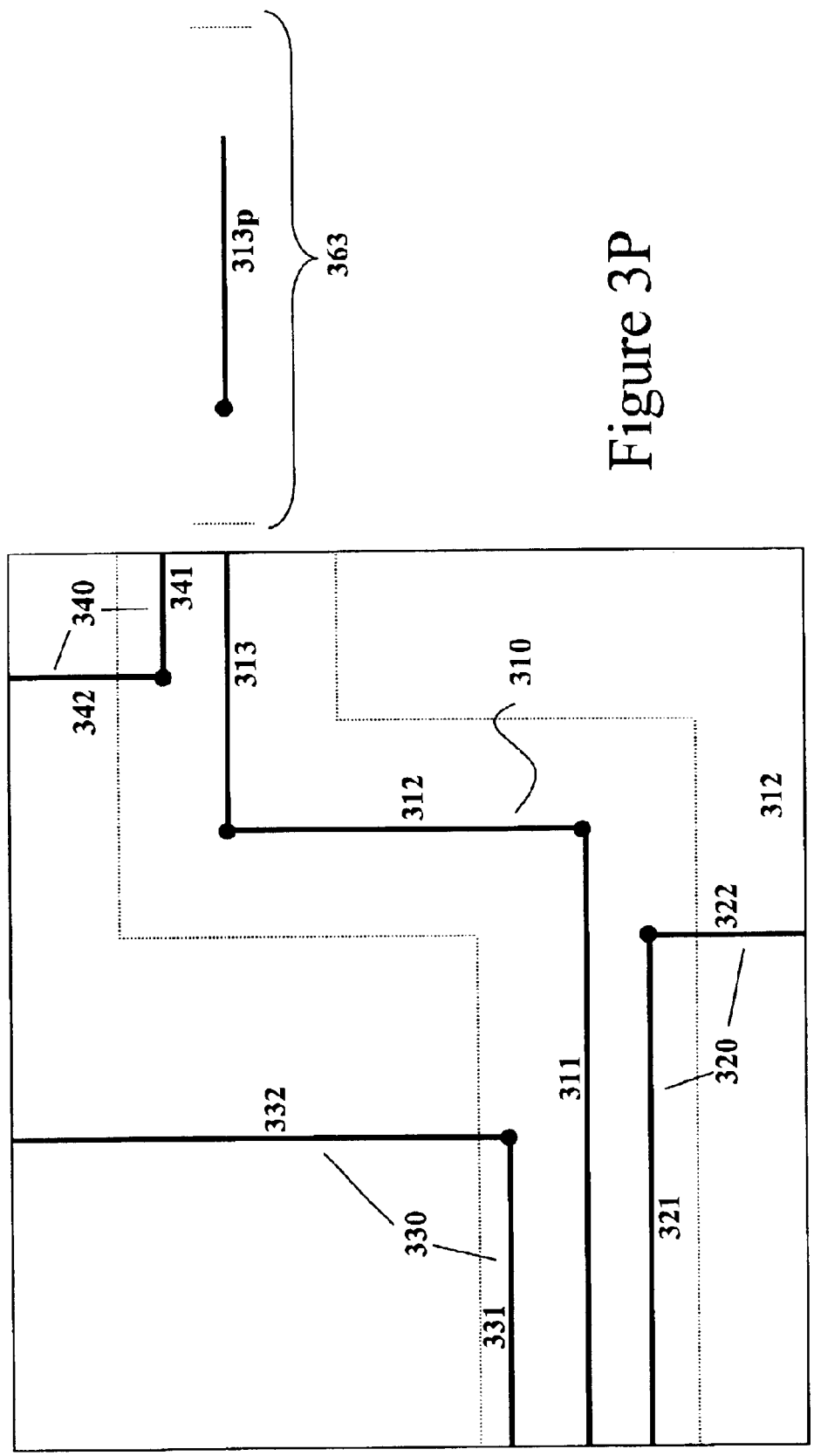

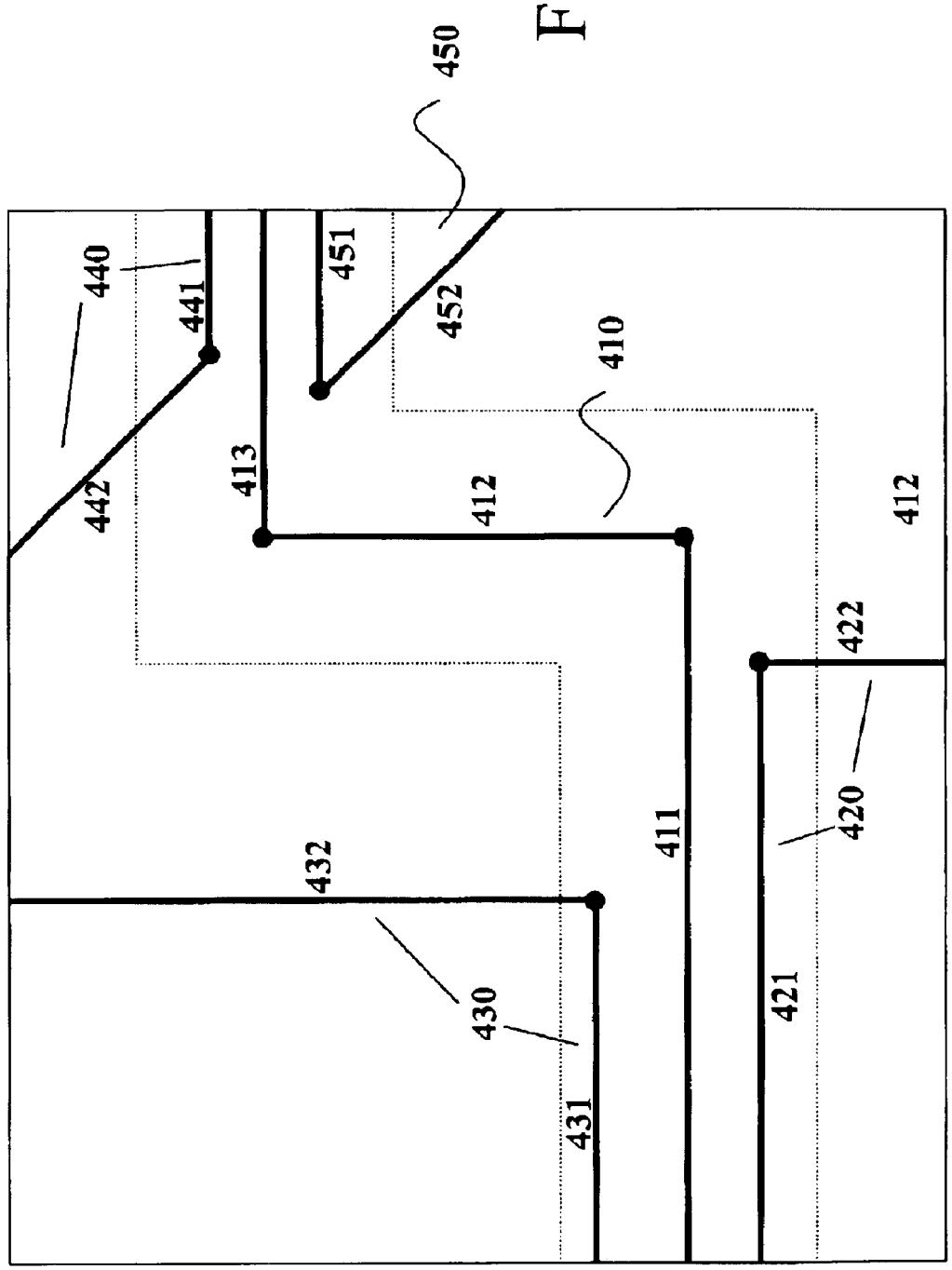

US 6,854,101 B2

METHOD AND ARRANGEMENT FOR EXTRACTING CAPACITANCE IN INTEGRATED CIRCUITS HAVING NON MANHATTAN WIRING

The present patent application is a continuation of the U.S. patent application entitled "Method and Arrangement for Extracting Capacitance Integrated Circuits Having Non-Manhattan Wiring" filed on Jun. 13, 2001 having Ser. No. 09/681,830 that is currently U.S. Pat. No. 6,581,198.

FIELD OF THE INVENTION

The present invention relates to the field of semiconductor design and manufacture. In particular the present invention discloses a method of extracting capacitance from semiconductor integrated circuit layouts.

BACKGROUND OF THE INVENTION

An integrated circuit ("IC") is a semiconductor device that includes many electronic components (e.g., transistors, diodes, inverters, etc.). These electrical components are interconnected to form larger scale circuit components (e.g., gates, cells, memory units, arithmetic units, controllers, decoders, etc.) on the IC. The electronic and circuit components of IC's are jointly referred to as "components."

Design engineers design IC's by transforming circuit description of the IC's into geometric descriptions, called integrated circuit layouts. To create an integrated circuit layout, design engineers typically use electronic design automation ("EDA") application programs. These EDA application programs are computer-based tools for creating, editing, and analyzing IC design layouts. EDA applications create layouts by using geometric shapes that represent different materials and devices on integrated circuits. For instance, EDA tools commonly use rectangular lines to represent the wire segments that interconnect the IC components. These EDA tools also represent electronic and circuit IC components as geometric objects with varying shapes and sizes.

After an integrated circuit layout has been created, the integrated circuit layout is tested and optimized by EDA testing tools. Common testing and optimization steps include extraction, verification, and compaction. The steps of extraction and verification are performed to ensure that the integrated circuit layout will perform as desired.

One of the critical measurements made during the extraction process is to determine the capacitance of the various interconnect wires in the integrated circuit layout. The capacitance will help determine the performance of the integrated circuit layout. Specifically, accurate estimates of the capacitances of the complicated three-dimensional structures in an integrated circuit are important for determining final integrated circuit speeds and functionality.

The task of extracting capacitance from an integrated circuit layout is a very difficult task due to the potential interactions between a very large number of interconnect wires within close proximity to each other. New routing systems are further complicating the task of extracting capacitance from an integrated circuit layout. Thus, it is desirable to implement new methods for extracting capacitance from integrated circuit layouts.

SUMMARY OF THE INVENTION

The present invention introduces a method of quickly extracting the capacitance for interconnect wires in an integrated circuit routed with a non Manhattan architecture. To extract the capacitance a section containing non Manhattan wiring, the present invention proposes an approximation system that approximates the section of non Manhattan wiring with a Manhattan wiring section that has a capacitance per unit length that is linearly proportional to the length of the approximated section. The capacitance affect from the approximated Manhattan wiring section is then adjusted with a correction factor. Specifically, the present invention proposes that the capacitance be calculated for interconnect wiring sections with the following equation:

$$\sum_{i=1}^{n} \Delta C_i + l_i \times C_i$$

Where $l_i$=the length of wiring section i; and $C_i$=the capacitance per unit length of the Manhattan wiring section or the approximated Manhattan wiring section i;

$\Delta C_i$=the capacitance correction factor for the approximated Manhattan wiring section i (this term is zero for Manhattan wiring sections).

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 3G illustrates the calculation of the capacitance for a fourth horizontal section of critical net 310.

FIG. 3K illustrates the calculation of the capacitance for an eighth horizontal section of critical net 310.

FIG. 3L illustrates the calculation of the capacitance for a ninth horizontal section of critical net 310.

FIG. 3P illustrates the calculation of the capacitance for a third vertical section of critical net 310.

FIG. 4 illustrates the interconnect wires of FIG. 3A wherein vertical wire 342 has been replaced with diagonal wire 442 and a fifth net 450 has been added.

FIG. 5B illustrates the capacitance effect problem of FIG. 5A after it has been divided into sections.

DETAILED DESCRIPTION OF THE PREFERRED EMBODIMENT

Methods for extracting capacitance in integrated circuits having non Manhattan wiring are disclosed. In the following description, for purposes of explanation, specific nomenclature is set forth to provide a thorough understanding of the present invention. However, it will be apparent to one skilled in the art that these specific details are not required in order to practice the present invention. For example, the present invention has mainly been described with reference to an example non Manhattan routing system that contains 45° angle wiring. However, the same techniques can easily be applied to many other types of non Manhattan routing systems.

Capacitance Effects

Figure 1A:
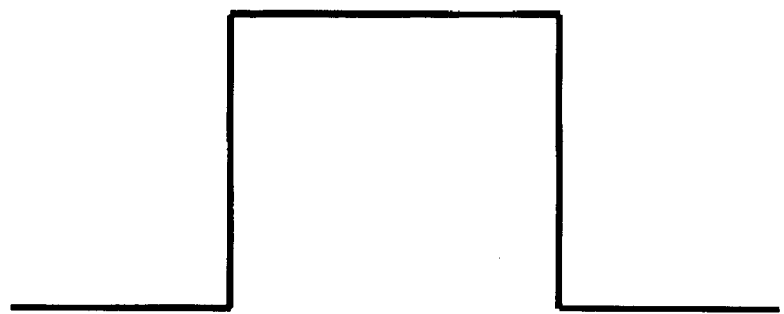
FIG. 1A illustrates an ideal signal pulse.

Semiconductor integrated circuits use metal layers with interconnect wires to carry electrical signals between various circuit elements. These interconnect wires are susceptible to performance degradation due to parasitic capacitance. For example, FIG. 1A illustrates an ideal digital signal pulse. Note that in the ideal digital signal pulse, the signal has an immediate transition between voltage levels such that the digital signal pulse appears very square. However, no real signal pulse can match the ideal digital signal pulse. One reason that such an ideal cannot be achieved is that parasitic capacitance in all circuits degrades the signal.

Figure 1B:
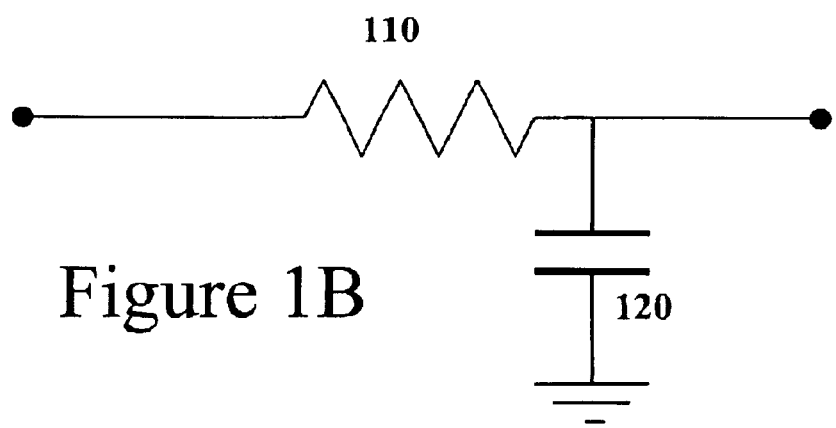
FIG. 1B illustrates a circuit for modeling parasitic capacitance.
Figure 1C:
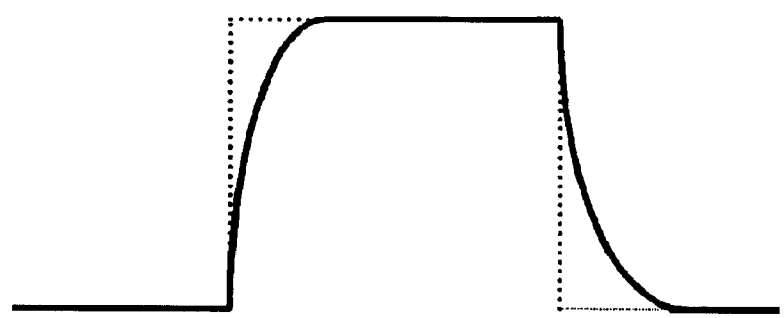
FIG. 1C illustrates the digital signal pulse of FIG. 1A after it has been affected by capacitance.

FIG. 1B illustrates how the parasitic capacitance of a net may be modeled. The capacitance may be modeled as an "RC" (Resistor-Capacitor) circuit. The resistor 120 lowers the voltage and the capacitor 110 must be charged or drained upon a voltage state change. FIG. 1C illustrates how the ideal digital signal pulse of FIG. 1A is more likely to appear in a real world application. Note that the resistor 120 and the need to charge the capacitor 110 slow the voltage rise. Similarly, the voltage drop is slowed.

Figure 2A:
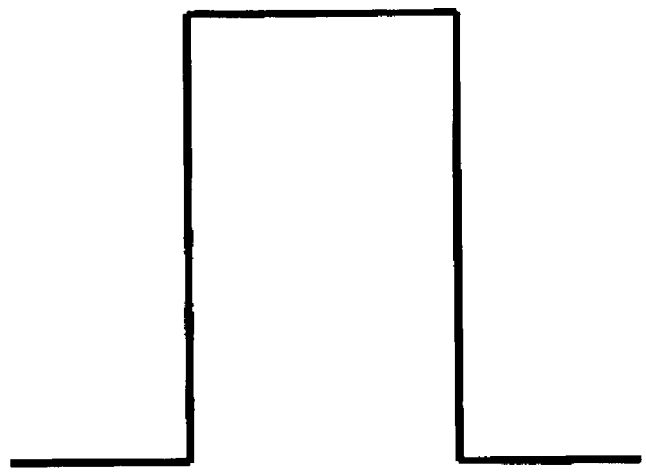
FIG. 2A illustrates an ideal signal pulse.
Figure 2B:
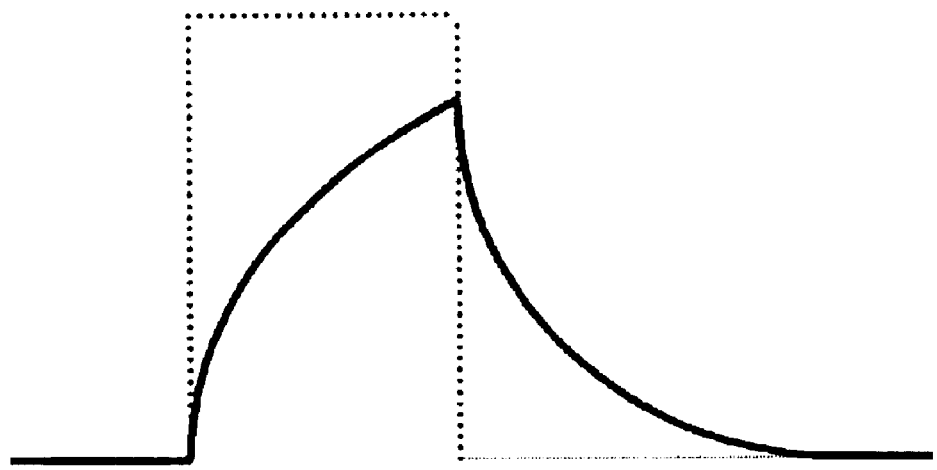
FIG. 2B illustrates a real world signal pulse that did not reach its full voltage level due to parasitic capacitance.

Severe capacitance can cause a circuit to malfunction. For example FIG. 2A illustrates an ideal digital signal pulse and FIG. 2B illustrates the ideal digital signal pulse of FIG. 2A after it has been affected by severe capacitance. As illustrated in FIG. 2B, the signal fails to reach the full active voltage level when it is affected by severe capacitance. Thus, capacitance may cause the read-out circuit to sample an incorrect voltage level.

Manhattan Architecture Capacitance Extraction

As illustrated with reference to FIGS. 1B and 1C, the resistance and capacitance of a net affect the ability of that net to carry a signal. Thus, it is desirable to determine these resistance and capacitance values to determine if the performance degradation is too severe. The resistance value of a interconnect wire can be relatively easily calculated using the geometry of the interconnect wire and the material composition of that interconnect wire. However, the capacitance value of an interconnect wire depends on the interconnect wire's proximity to other interconnect wires. Thus, one must consider the effects of all nearby interconnect wires to extract the capacitance of a particular interconnect wire.

A Manhattan Wiring Example

Figure 3A:
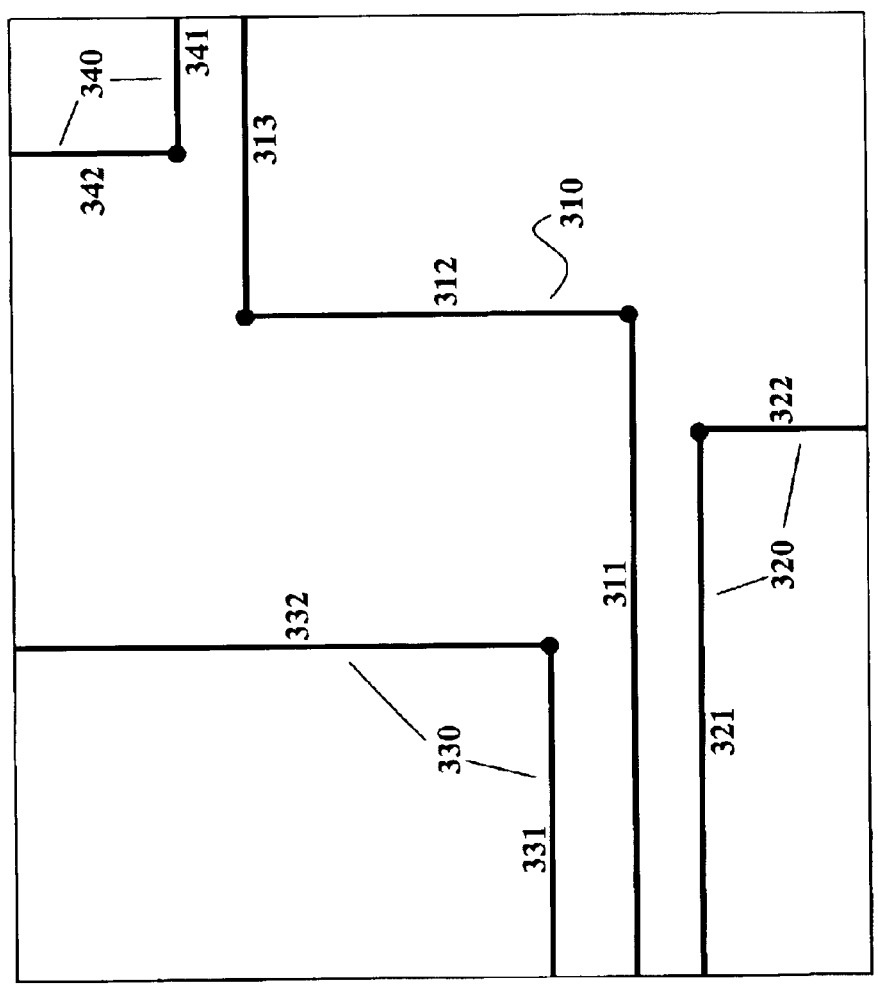
FIG. 3A illustrates an example of interconnect wires arranged for an integrated circuit layout.

In a typical "Manhattan" routed integrated circuit, all interconnect wires are vertical or horizontal. This orthogonal wiring architecture allows for certain efficiencies in extracting the capacitance for an interconnect wire. FIGS. 3A to 3P will be used to describe how capacitance is extracted in certain prior art systems that are limited to Manhattan routing architectures.

FIG. 3A illustrates the top view an example layer of interconnect wiring for an integrated circuit that uses Manhattan (only horizontal and vertical) interconnect wire routing. The example of FIG. 3A contains four different "nets" (conductors) 310, 230, 330, and 340. Each net illustrated in FIG. 3A is constructed only from horizontal interconnect wire segments and vertical interconnect wire segments as is required by Manhattan wire routing. For example, net 310 is constructed from horizontal wire segment 311, vertical wire segment 312, and horizontal wire segment 313. Similarly, net 320 is constructed from horizontal interconnect wire segment 321 and vertical interconnect wire segment 312.

For this example, we will determine the capacitance of critical net 310 in FIG. 3A. In common capacitance extraction parlance, the interconnect wiring of net 310 will be the "aggressor" wire and the other wire segments that effect the capacitance of net 310 will be the "victim" wires.

Limiting the Capacitance Extraction Problem

Figure 3B:
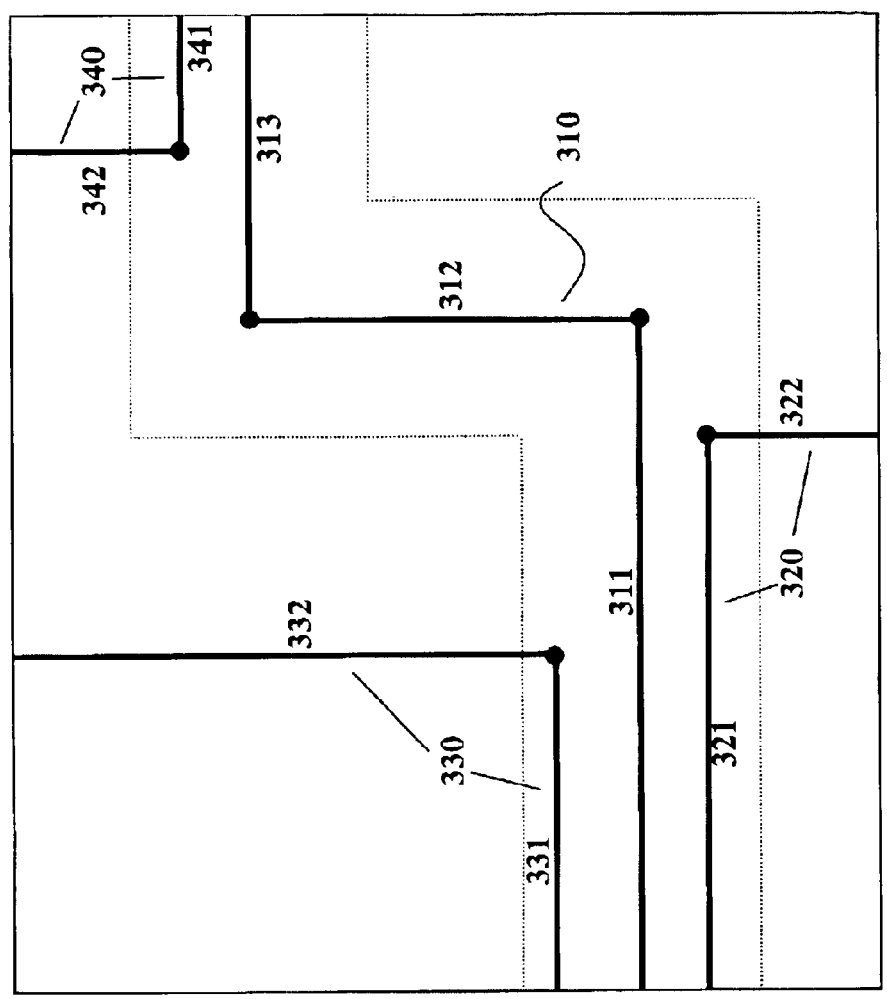
FIG. 3B illustrates the interconnect wires of FIG. 3A with a capacitance effect "halo" drawn around critical net 310.
Figure 3C:
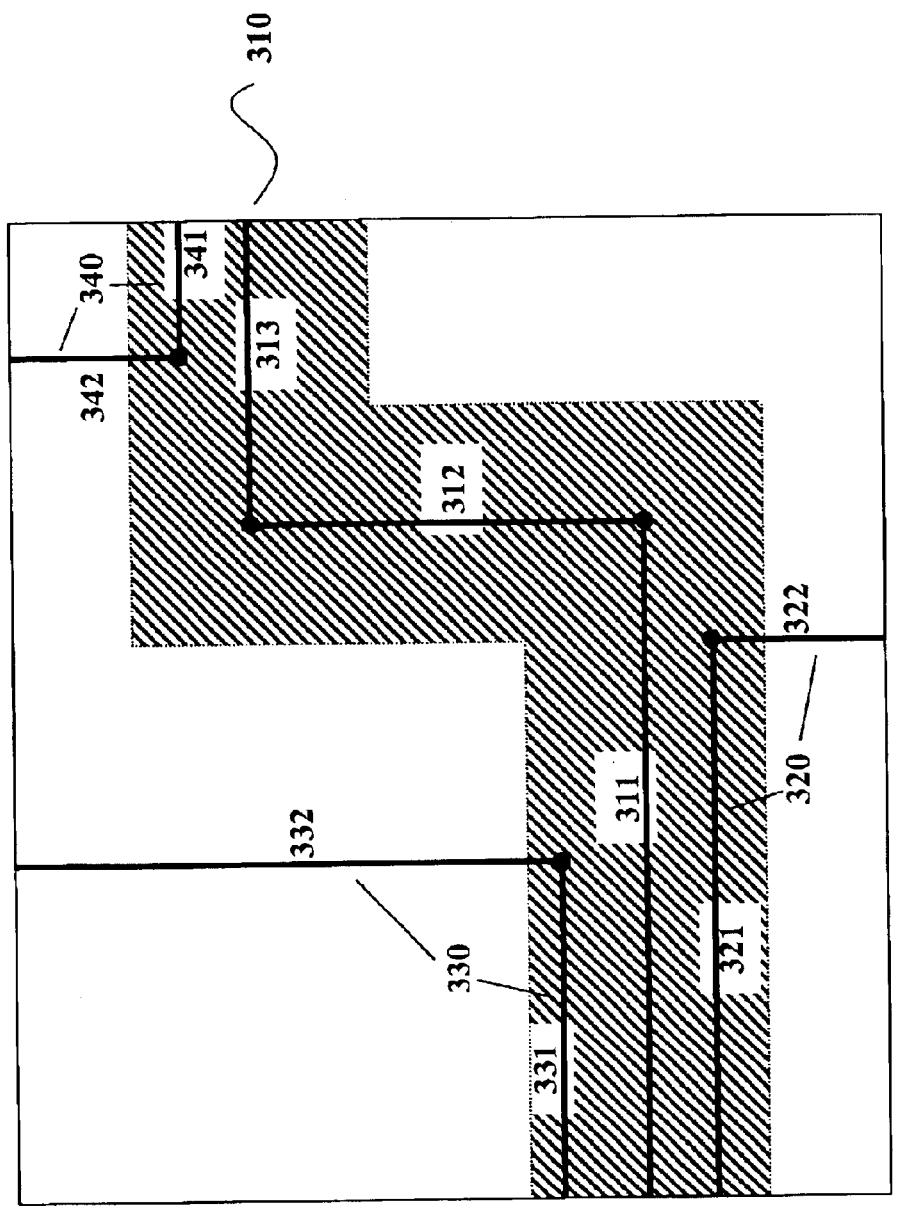
FIG. 3C illustrates the interconnect wires of FIG. 3B with the capacitance effect region around critical net 310 highlighted.

The first step in determining the capacitance of net 310 is to limit the scope of the capacitance extraction problem. Interconnect wires that are far from net 310 will only have a very tenuous effect on the capacitance of net 310 and therefore can be ignored. Thus, FIG. 3B illustrates a "halo" drawn around net 310 that will limit the scope of other interconnect wires considered to materially affect the capacitance of net 310. Specifically, all the interconnect wires within the shaded region of FIG. 3C will be considered to affect the capacitance of net 310. Any interconnect wires not within the shaded region of FIG. 3C will be considered to have no material affect the capacitance of net 310.

The most common current technique for computing capacitance effects (also known as extracting capacitance values) due to a three-dimensional configuration of interconnecting wires is to decompose the problem into a series of two-dimensional profiles that have capacitance values proportional to their length. The total capacitance of the three-dimensional net configuration is then determined by calculating a weighted sum of the individual two-dimensional profiles where the weights are the lengths of the different two-dimensional profiles. This technique is performed along two different dimensions such that there is both a horizontal and vertical scan of the interconnect wire section.

Thus, the first step in extracting the capacitance in a Manhattan routed integrated circuit is to divide the problem into a series of two-dimensional profiles wherein each two-dimensional profile has capacitance value that is proportional to its length. Thus, each two-dimensional profile will be unchanging in one dimension such that the length can be multiplied by a capacitance per length value. The capacitance per length value of the two-dimensional profile is calculated by running a two-dimensional field solver and then generating a model for the capacitance of the two-dimensional profile. There are a limited number of two-dimensional profiles such that only a limited number of two-dimensional profile capacitance models need to be created.

Figure 3D:
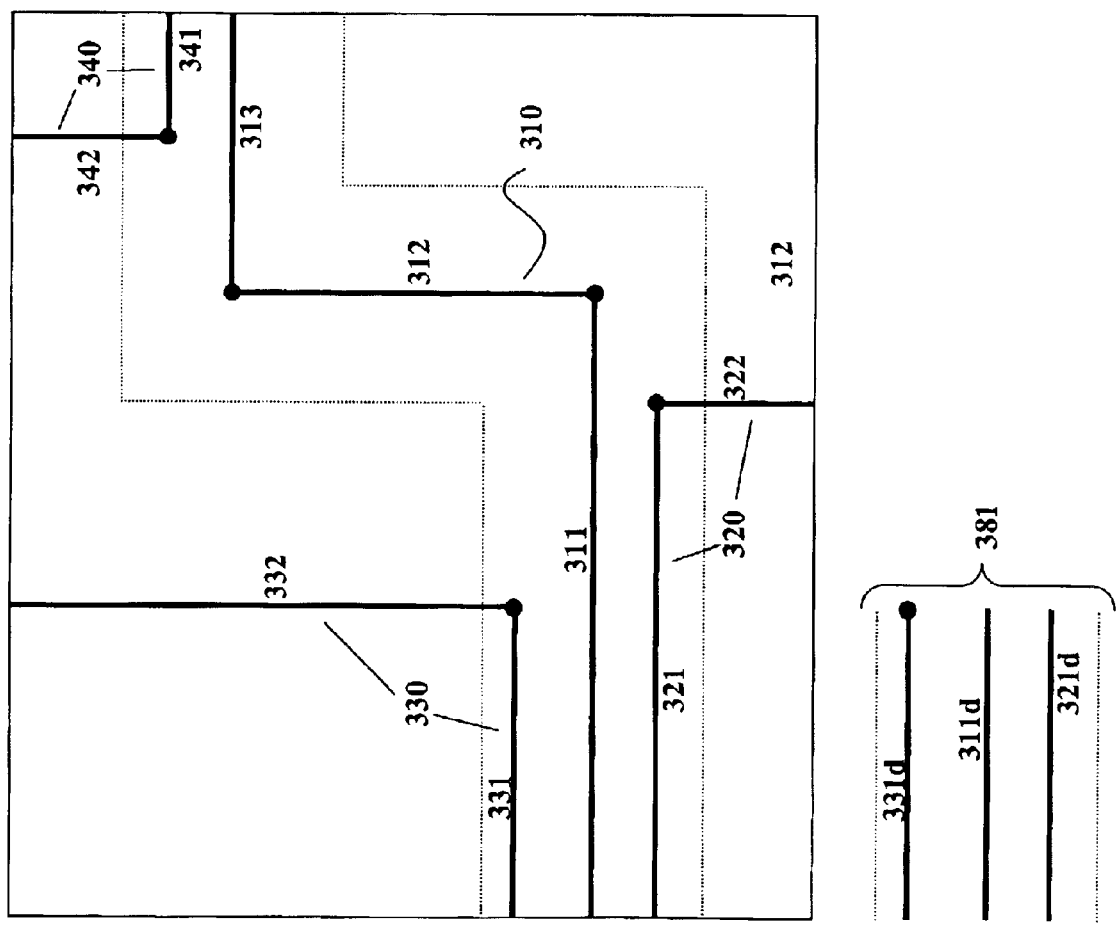
FIG. 3D illustrates the calculation of the capacitance for a first horizontal section of critical net 310.

FIGS. 3D to 3L illustrate the horizontal scan of the integrated circuit of FIG. 3A. The scan begins on the left side with FIG. 3D. FIG. 3D illustrates the interconnect wiring of FIG. 3A with a first two-dimensional section 381 of interconnect wire 311 duplicated below the integrated circuit. As illustrated in FIG. 3D, the duplicated section of interconnect wire 311 is surrounded by an environment unchanging along one (horizontal) dimension within the "halo" until horizontal interconnect wire 331 intersects with vertical interconnect wire 332. To calculate the capacitance for this first two-dimensional section 381 of interconnect wiring, the modeled capacitance per unit length of section 381 is multiplied by the length of section 381 (the length of interconnect wire 331).

Figure 3E:
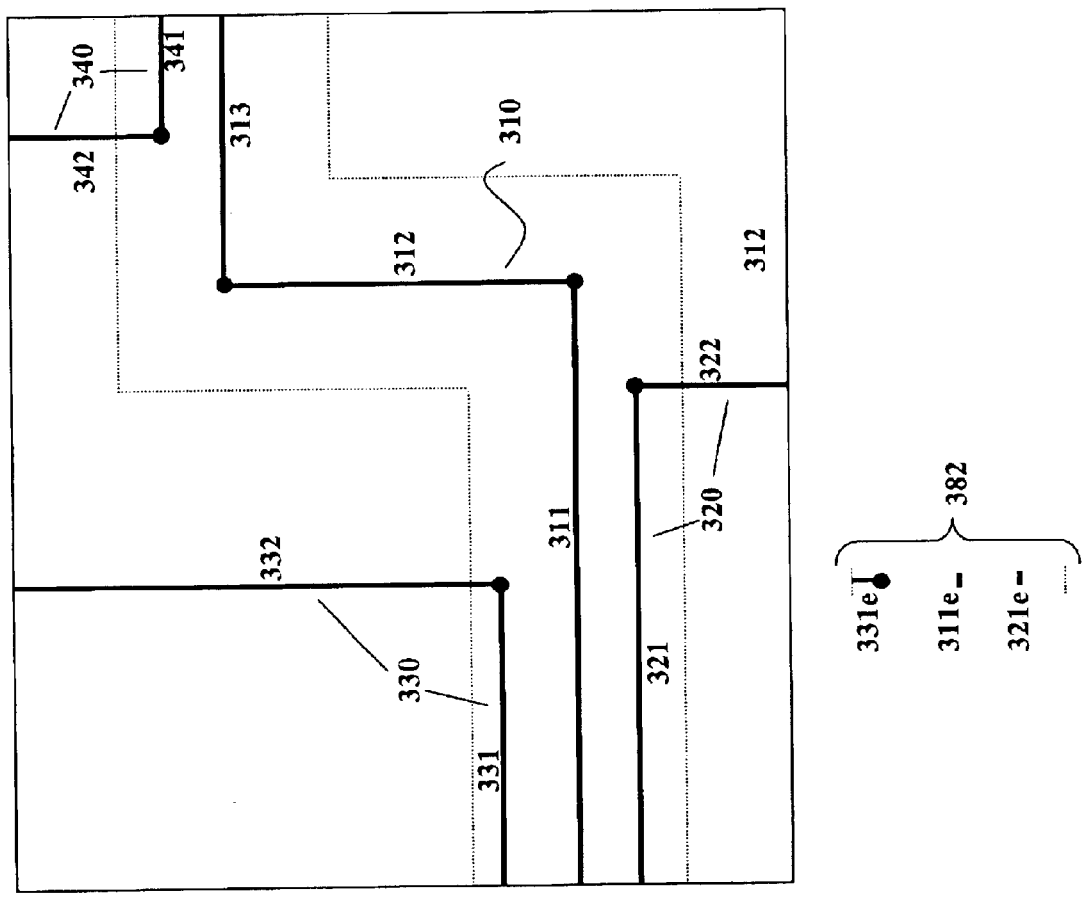
FIG. 3E illustrates the calculation of the capacitance for a second horizontal section of critical net 310.

At the point where horizontal interconnect wire 331 intersects with vertical interconnect wire 332, the surrounding environment around interconnect wire 311 of net 310 changes. Thus, a second different section 382 of net 310 is duplicated below the integrated circuit in FIG. 3E. The short section 382 of FIG. 3E is used to take into account the capacitance effect of vertical interconnect wire 332 on horizontal interconnect wire 311 of net 310. To determine the capacitance of section 382, the modeled capacitance per unit length of section 382 is multiplied by the length of section 382 (the width of vertical interconnect wire 332).

Figure 3F:
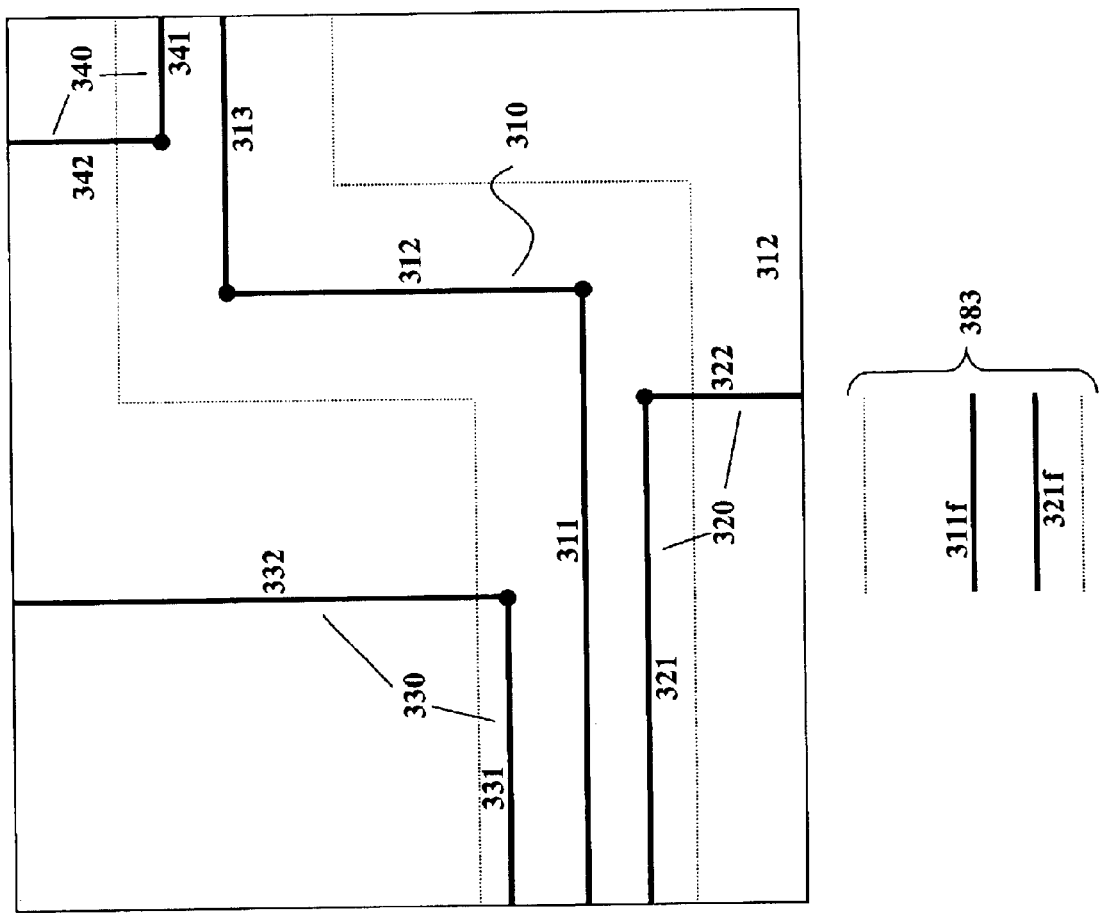
FIG. 3F illustrates the calculation of the capacitance for a third horizontal section of critical net 310.

FIG. 3F illustrates the interconnect wiring for an integrated circuit of FIG. 3A with a third two-dimensional section 383 of net 310 duplicated below the integrated circuit. In the third section 383, horizontal wire 311 of net 310 is only affected by horizontal wire 321. The capacitance effect of horizontal wire 321 on interconnect wire 311 per unit length is multiplied by the horizontal distance from vertical interconnect wire 332 to vertical interconnect wire 322. Next, a fourth two-dimensional section 384 of net 310 illustrated in FIG. 3G is taken into account by multiplying the capacitance effect of section 384 by the width of vertical interconnect wire 322.

Figure 3H:
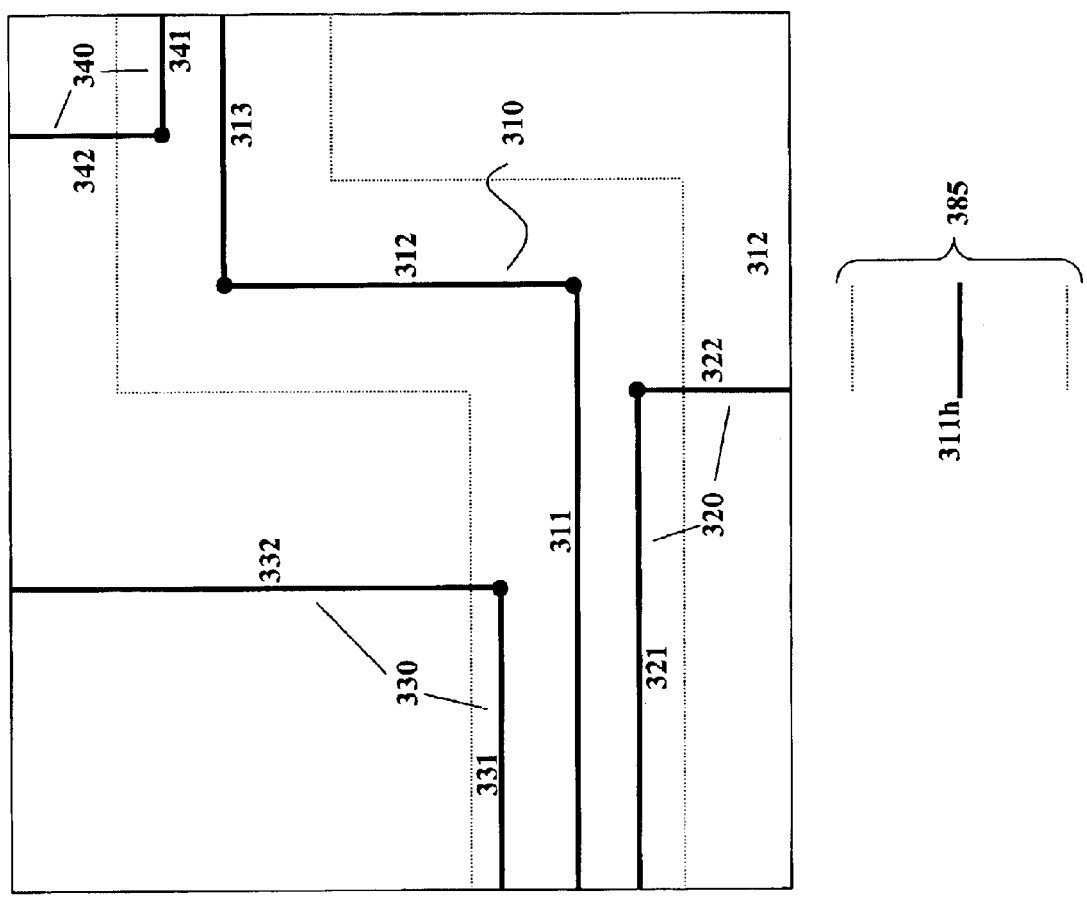
FIG. 3H illustrates the calculation of the capacitance for a fifth horizontal section of critical net 310.
Figure 3I:
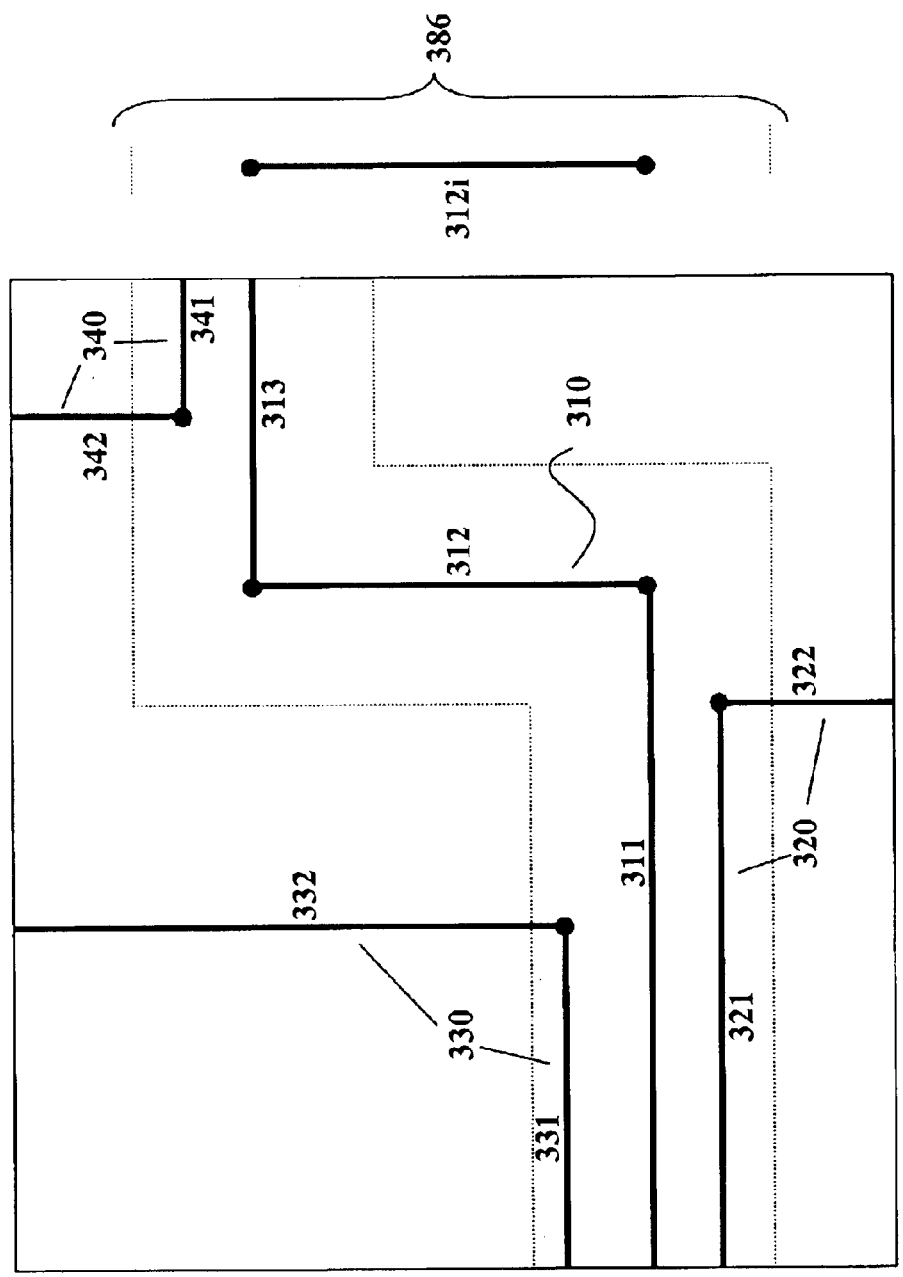
FIG. 3I illustrates the calculation of the capacitance for a sixth horizontal section of critical net 310.

FIG. 3H illustrates a fifth section 385 of net 310 that consists of the final section of horizontal interconnect wire 311. As illustrated in FIG. 3H, there are no other interconnect wires within the halo around section 385, thus there is not significant capacitance effect for section 385 of net 310. At the end of horizontal interconnect wire 311, net 310 extends upward with vertical interconnect wire 312. FIG. 3I illustrates a sixth horizontal section 386 of net 310 representing a duplicate of the vertical interconnect wire 312 portion of net 310. As with previous section 385, the halo around section 386 contains no other interconnect wires such that there is no significant capacitive effect.

Figure 3J:
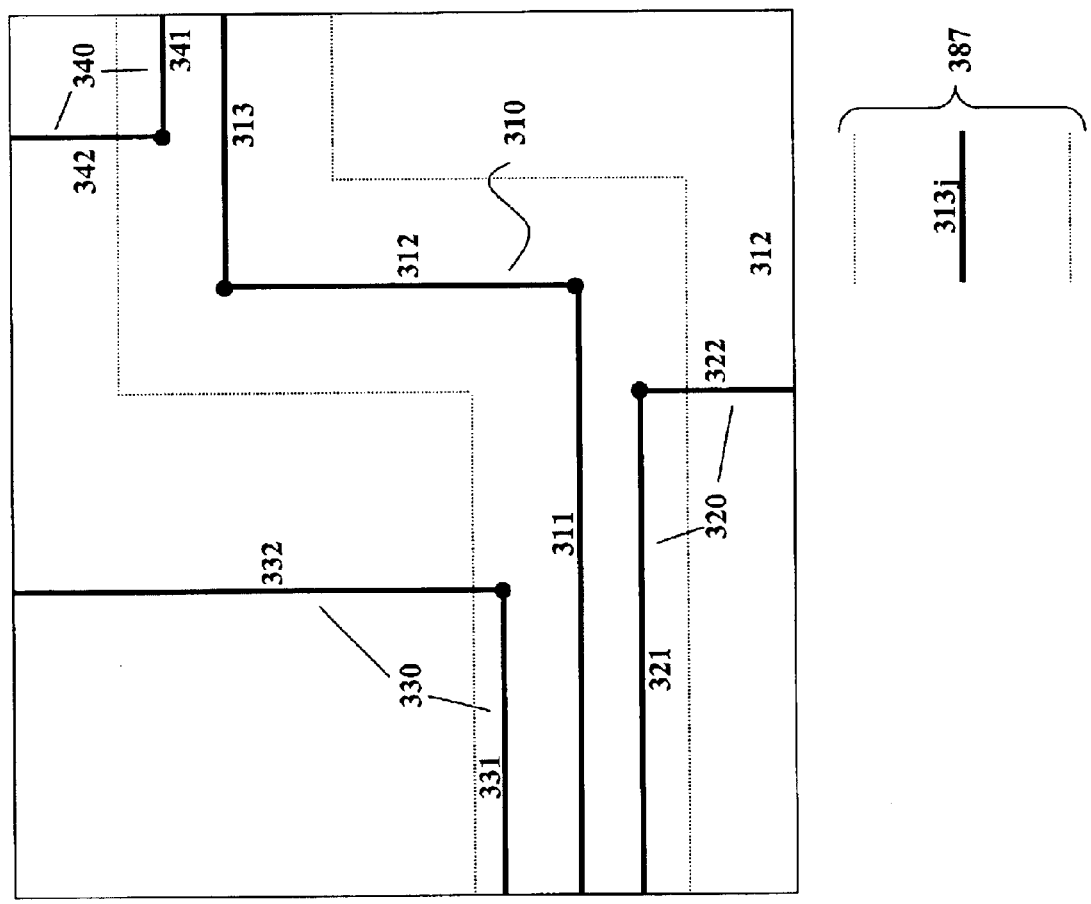
FIG. 3J illustrates the calculation of the capacitance for a seventh horizontal section of critical net 310.

After vertical section 312, net 310 becomes horizontal again with horizontal interconnect wire 313. The seventh section 387 of 386 consists of part of horizontal interconnect wire 313 as illustrated in FIG. 3J. Section 387 has no capacitive effect since no other interconnect wires are within the halo. Finally, FIGS. 3K and 3L address the capacitive effects of interconnect wires 342 and 341 on horizontal interconnect wire 313 of net 310, respectively.

Figure 3M:
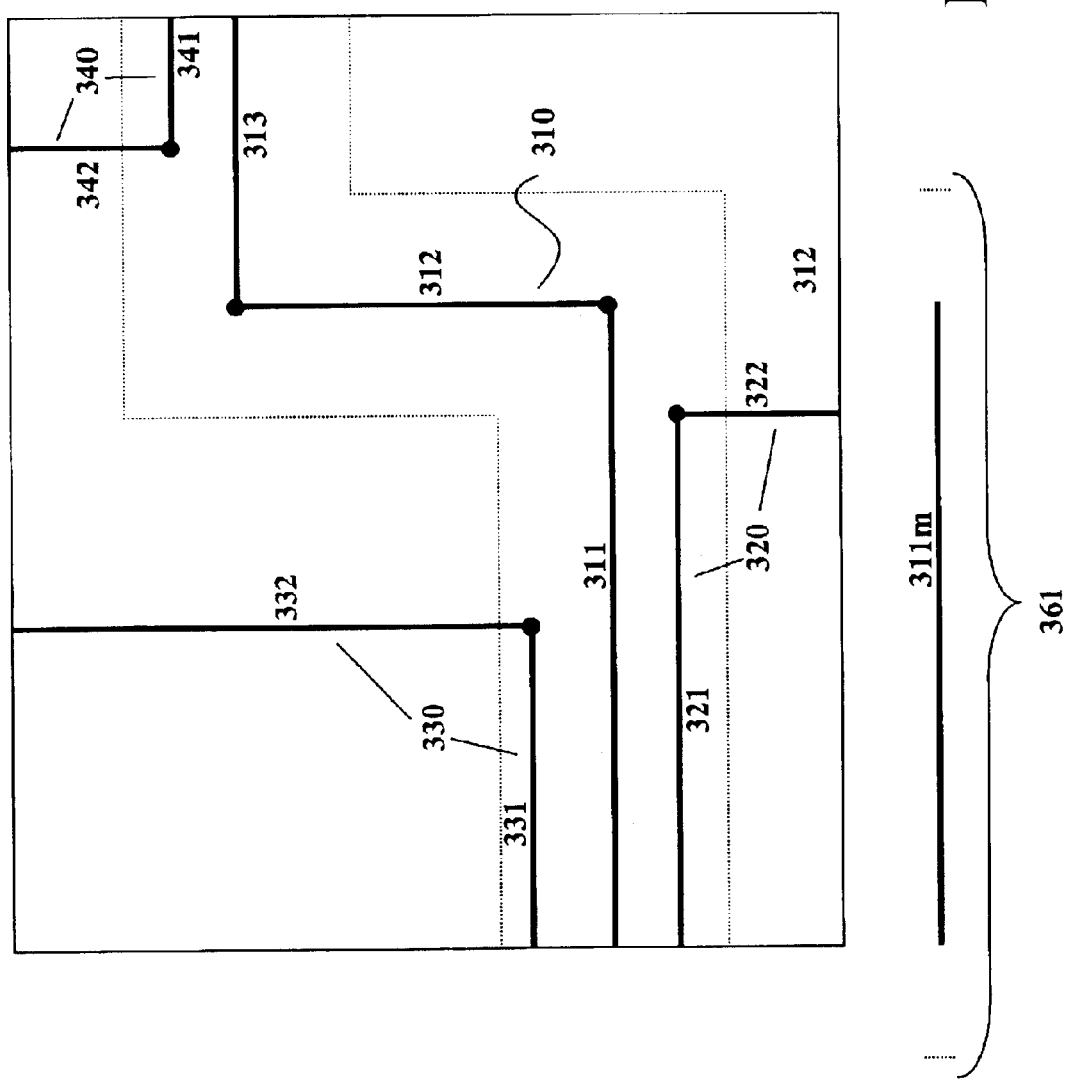
FIG. 3M illustrates the calculation of the capacitance for a first vertical section of critical net 310.
Figure 3N:
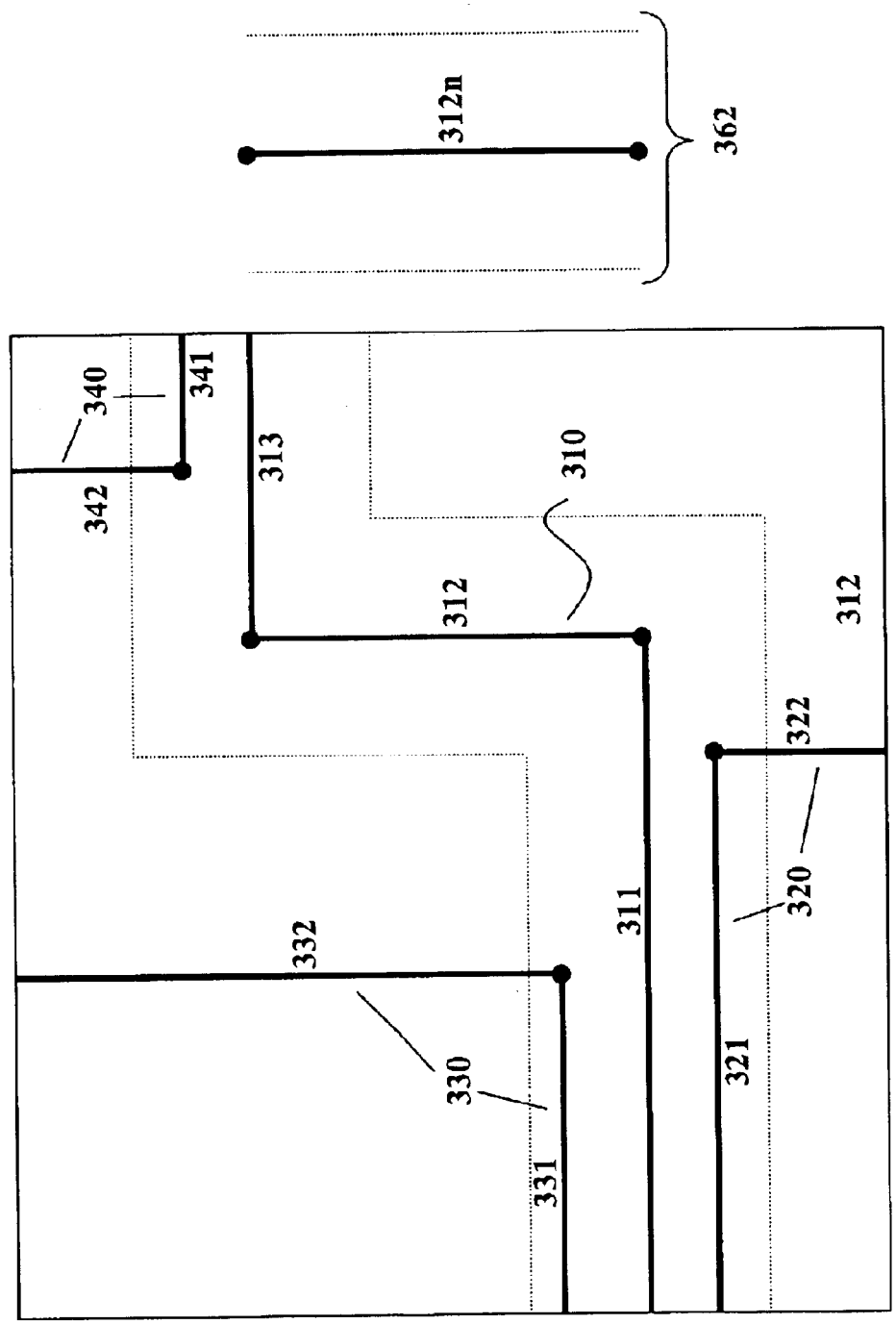
FIG. 3N illustrates the calculation of the capacitance for a second vertical section of critical net 310.

FIGS. 3M, 3N, and 3P illustrate the vertical scan of the net 310 of FIG. 3A starting from the bottom in FIG. 3M. As illustrated in FIG. 3M, there is no capacitive effect in section 361. Similarly, there is no capacitive effect in sections 361 and 362 as illustrated in FIGS. 3N and 3P.

The fully modeled capacitance of net 310 is calculated by summing together the modeled capacitance of each of the individual sections 381 to 389 illustrated in FIGS. 3D to 3L, respectively. (The vertical scan is being ignored since no capacitive effect was detected during the vertical scan.) The capacitance of each individual section is calculated by multiplying the length of that section by the capacitance per unit length of that section profile. Thus the total capacitance for net 310 may be calculated as follows:

$$\sum_{i=1}^{9} l_i \times C_i = l_1 \times C_1 + l_2 \times C_2 + l_3 \times C_3 +$$

$$l_4 \times C_4 + l_5 \times C_5 + l_6 \times C_6 + l_7 \times C_7 + l_8 \times C_8 + l_9 \times C_9$$

where $l_i$=the length of interconnect wiring section i; and
$C_i$=the capacitance per unit length of interconnect wiring section i.

Non-Manhattan Architecture Capacitance Extraction

In a non Manhattan wiring architecture that allows more than just horizontal and vertical interconnect wires, an extraction system cannot always divide a capacitance extraction problem into two dimensional profiles that are unchanging along one dimension. Specifically, diagonal wiring will cause some sections to have capacitance profiles that vary along the scanned direction. Thus, one cannot use the technique of simply create a capacitance per unit length profile model and multiplying that profile model by length.

Figure 5A:
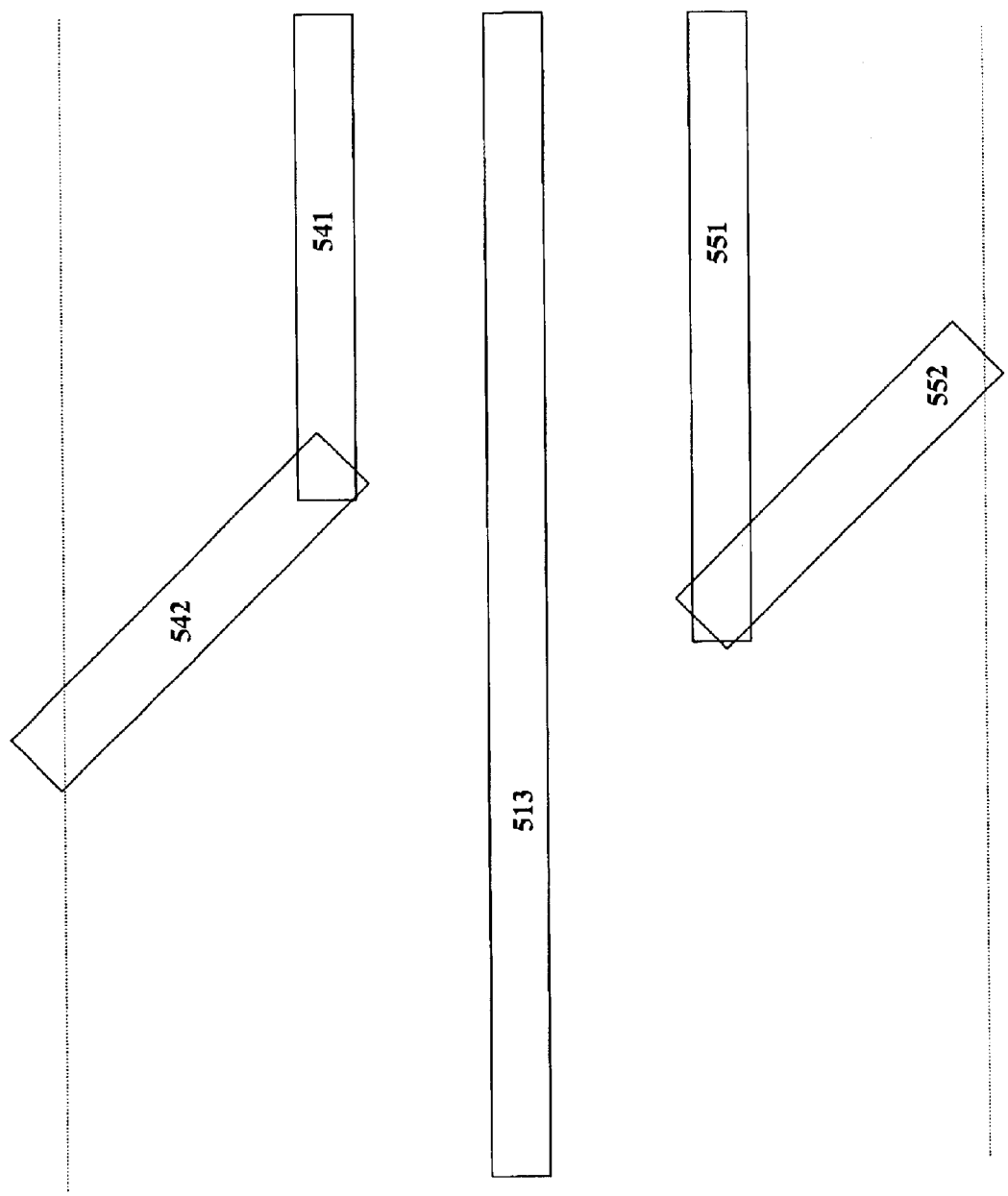
FIG. 5A illustrates a detailed view of nets 440 and 450 around interconnect wire 413 of FIG. 4.

For example, FIG. 4 illustrates an example section of interconnect wiring for an integrated circuit with non Manhattan wire routing. The example section of interconnect wiring for an integrated circuit of FIG. 4 is very similar to the section of interconnect wiring illustrated in FIG. 3A except that interconnect wire 342 of FIG. 3A has been replaced with a diagonal interconnect wire 442 and a fifth net 450 has been added. FIG. 5A illustrates a detailed view of the changed area around net 410. Specifically, FIG. 5A illustrates aggressor line 513, diagonal wire 542, horizontal wire 541, diagonal wire 552, and horizontal wire 551. As illustrated in FIG. 5A, the diagonal wires 542 and 552 will cause capacitance effects that are not linearly proportional along the horizontal axis.

The present invention introduces a method of quickly extracting the capacitance for interconnect wires in an integrated circuit routed with a non Manhattan architecture. To extract the capacitance of a section containing non Manhattan wiring, the present invention proposes an approximation system that approximates the section of non Manhattan wiring with a Manhattan wiring section that has a capacitance per unit length that is linearly proportional to the length of the approximated section. The capacitance effect from the approximated Manhattan wiring section is then adjusted with a correction factor. Thus, the present invention proposes that the total capacitance be calculated for interconnect wiring sections with the following equation:

$$\sum_{i=1}^{n} \Delta C_i + l_i \times C_i$$

where l$_i$=the length of wiring section i; and

C$_i$=the capacitance per unit length of the Manhattan wiring section or the approximated Manhattan wiring section i;

ΔC$_i$=the capacitance correction factor for the approximated Manhattan wiring section i (this term is zero for Manhattan wiring sections).

To illustrate the method of the present invention, the capacitance effect of net 440 and net 450 on net 410 of FIG. 4 will be determined with reference to FIGS. 5A to 5N, 6A to 6D, and 7.

Figure 5B:
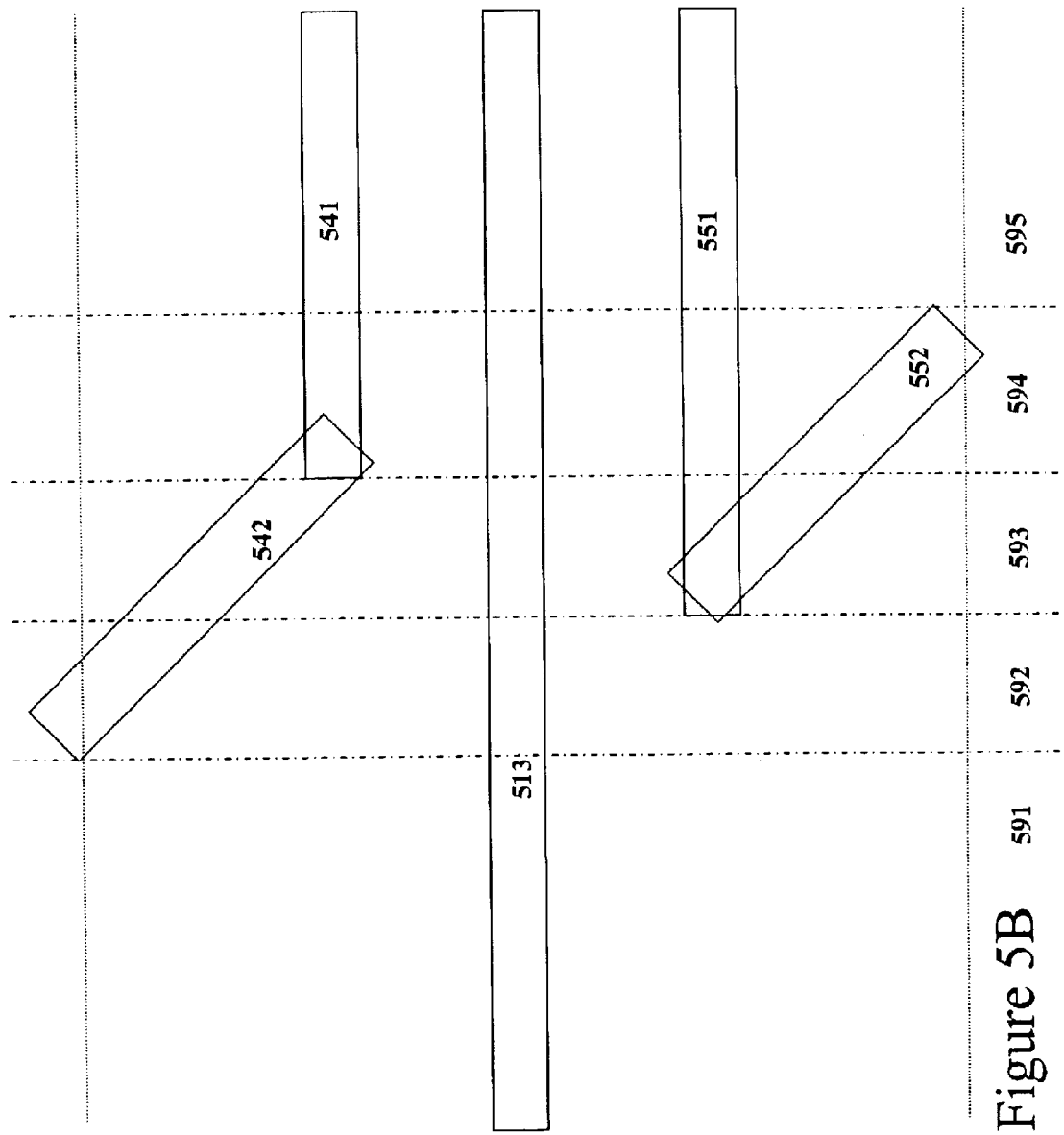
FIG. 5B illustrates the detailed view of FIG. 5A after it has been divided into orthogonal and non orthogonal sections 591 to 595.
Figure 7:
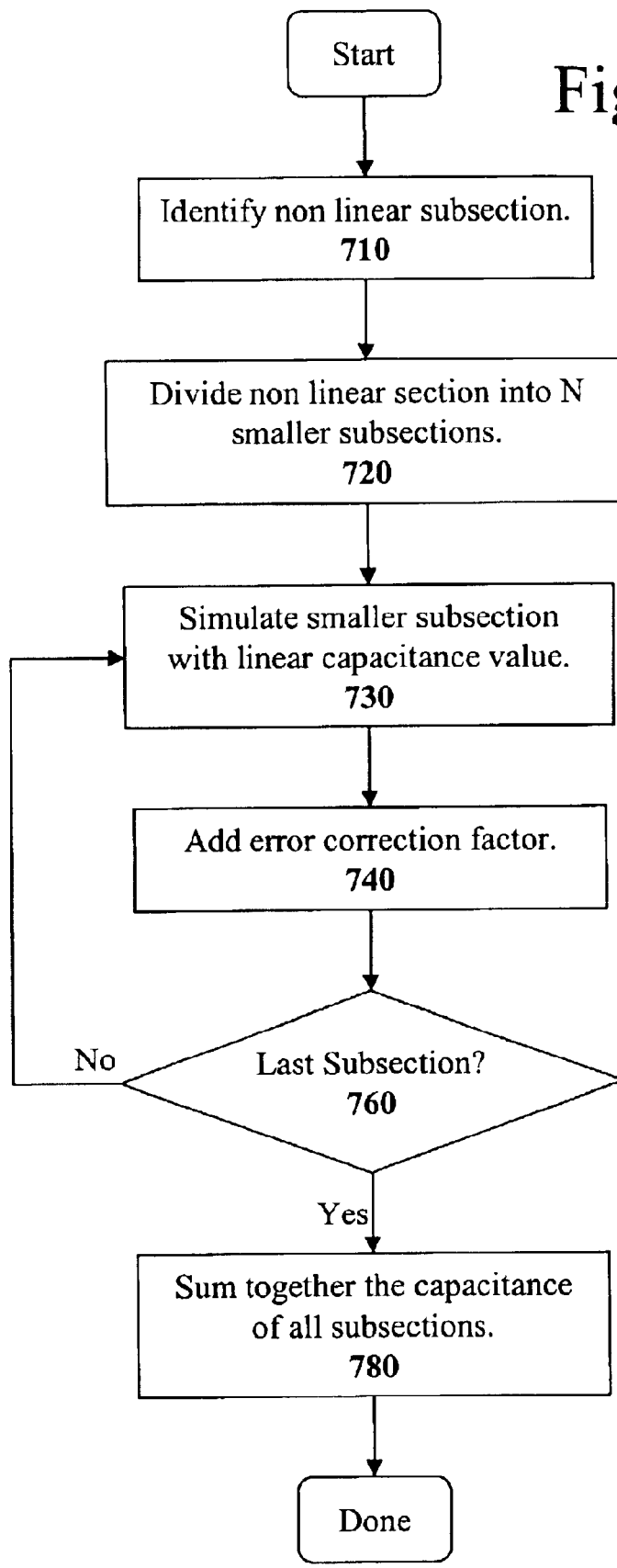
FIG. 7 illustrates a flow diagram that describes how non linear sections of a non Manhattan capacitance extraction may be solved.

FIG. 7 illustrates a flow diagram that describes one embodiment of the method of the present invention. The first step, step 710, is to divide the problem into orthogonal and non orthogonal sections. FIG. 5B illustrates the interconnect wiring of FIG. 5B after it has been divided into five sections 591 to 595.

After dividing the problem into sections, the system then handles each section individually. The first step is to determine if the section is orthogonal. If the section is orthogonal, like section 591, then the system proceeds to step 750 and handles the standard orthogonal section as previously described.

Figures 5C, 5D:
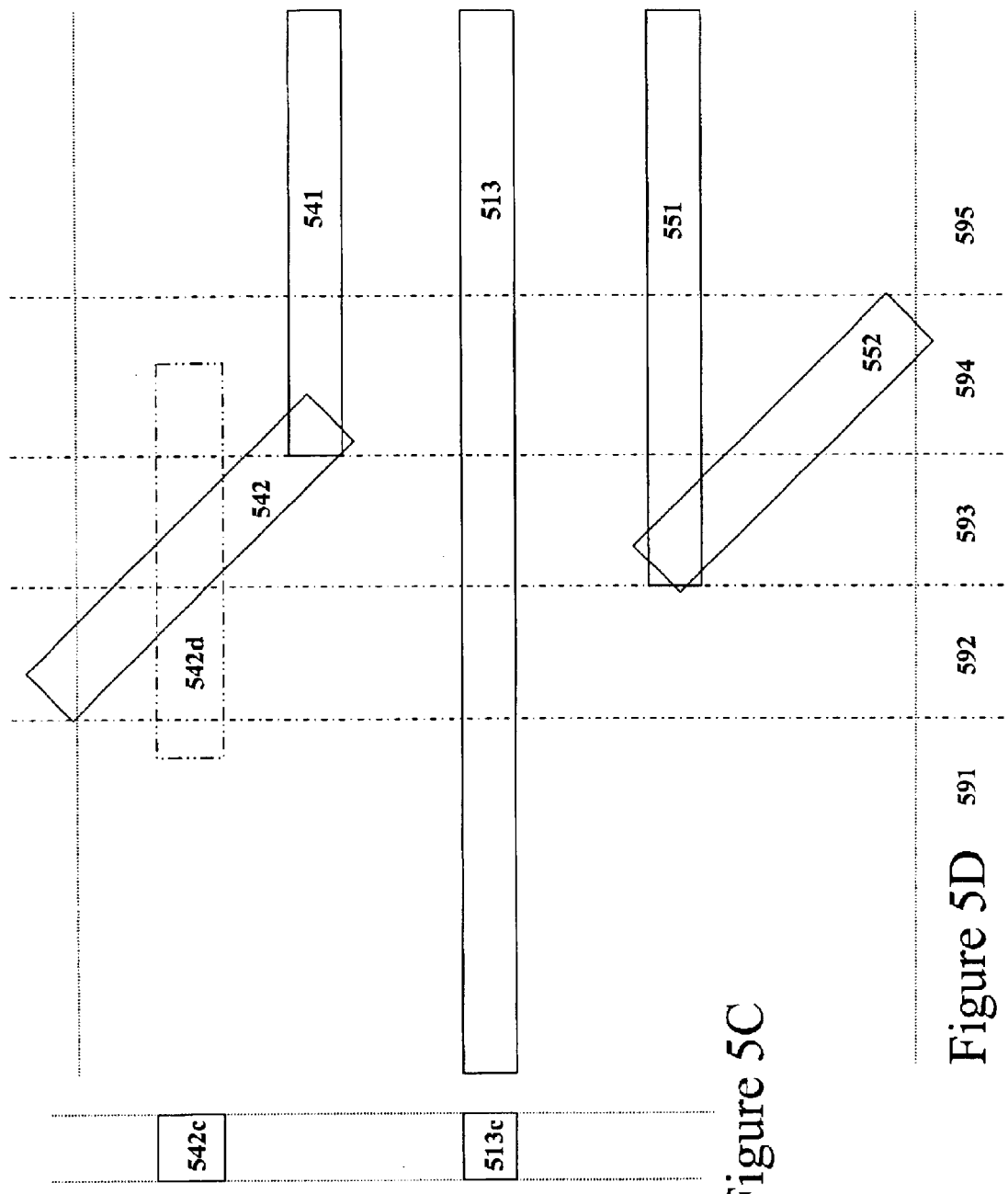
FIG. 5C illustrates a side view of the approximated profile for section 592 of FIG. 5D.
FIG. 5D illustrates the capacitance effect problem of FIG. 5A with interconnect line 542 rotated to create approximated interconnect line 542d to approximate section 592.

If the section is not orthogonal, like section 592, then the system proceeds to step 730 where it approximates the non orthogonal section with an orthogonal section. For example, section 592 may be approximated by rotating wire 542 as illustrated by FIG. 5D. The capacitance is then determined for the approximated orthogonal section in step 735 as is done for the other orthogonal sections. FIG. 5C illustrates a side view of the approximated two-dimensional orthogonal profile used to approximate the real non orthogonal section that varies along the horizontal direction.

Figure 6C:
FIG. 6C illustrates a side view of the approximated profile of FIG. 6B.
Figure 6B:
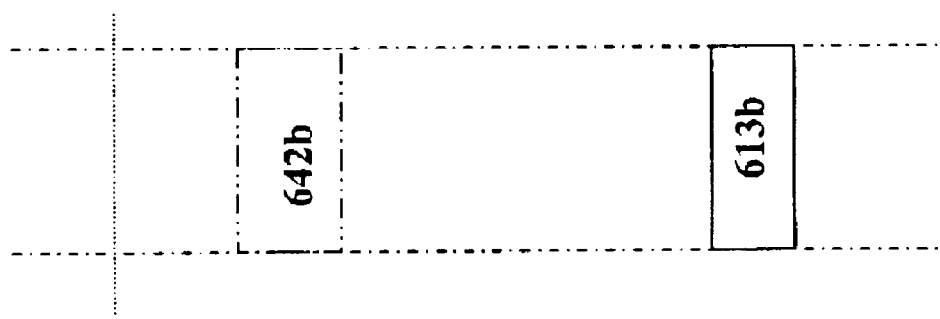
FIG. 6B illustrates the approximated profile of the capacitance effect problem in FIG. 6A.
Figure 6A:
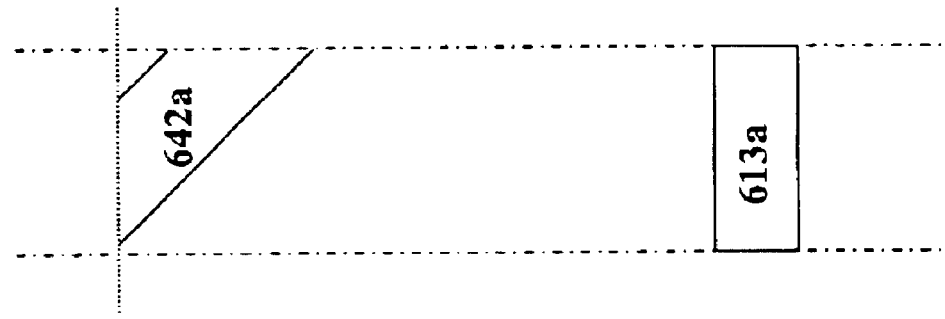
FIG. 6A illustrates the real capacitance effect problem for section 592 from FIG. 5D.

Next, at step 740 in FIG. 7, a correction factor is added. The correction factor takes into account the difference between the real interconnect wire segment 542 and the approximated interconnect wire segment 542d as illustrated in FIG. 5D. FIG. 6A illustrates real interconnect wire segment 642a and interconnect wire segment 613a. FIG. 6B illustrates approximated interconnect wire segment 642b and interconnect wire segment 613b. A detailed three-dimensional capacitance value is calculated for both the real profile of FIG. 6A and the approximated profile FIG. 6BD using a three-dimensional capacitance field solver. There are a limited number of different two-dimensional profiles such that only a limited number of detailed three-dimensional calculations need to be performed by a three-dimensional capacitance field solver. In one embodiment, the various different profiles is limited by restricting the relative angles between wires to be between thirty and sixty degrees. The difference between the three-dimensional capacitance value for the real profile of FIG. 6A and the three-dimensional capacitance value for the approximated profile of FIG. 6B is the correction factor that needs to be added to the approximated model profile. Thus, that correction factor is added to the linear capacitance value calculated by approximated interconnect wire 642b in FIG. 6B to obtain the real capacitance value caused by real interconnect wires 642a in FIG. 6A.

Referring back to FIG. 7, at step 760, the system determines if the last section has been handled. If the last section has not yet been handled, the system loops back to steps 720 to handle the remaining sections. For the example illustrated in FIG. 5B, the system will proceed to calculate capacitive effects caused by sections 593 to 595.

Finally, at step 780, the various capacitance values calculated for the various sections are added together to create a full capacitance value for the analyzed net. Thus, the calculated capacitance values for sections 591 to 595 illustrated in FIG. 5B are added together to determine the full capacitance effect that interconnect wires 541, 542, 551, and 552 have on interconnect wire 513 as illustrated in FIG. 5A.

With regard to different layers, it was observed that the effect on capacitance of the non-Manhattan segments separated by two layers or more from the aggressor segment was insignificant. Thus, these segments had more of a density type of effect. Segments on these layers could, therefore, be modeled with a Manhattan profile configuration.

The accuracy of the method set fort in FIG. 7 can be quite high since the correction factors are usually quite small for small profile lengths and angular variations between thirty and sixty degrees. However, the correction factors do need to be taken into account since the errors resulting from ignoring them could accumulate to over-predict capacitance values by a large margin. The other advantage of this approach is that a relatively small subset of models needs to be calculated specifically for the non-Manhattan configuration. This reduces the combinatorial explosion that necessarily results for modeling a profile with a large number of segments. The third advantage is that the capacitance field solutions of a relatively small number of 3D profiles are required to obtain an accurate model of the correction factors. Since 3D field solution is inherently more expensive than its 2D counterpart, the proposed modeling technique becomes very quick.

Figures 5E, 5F:
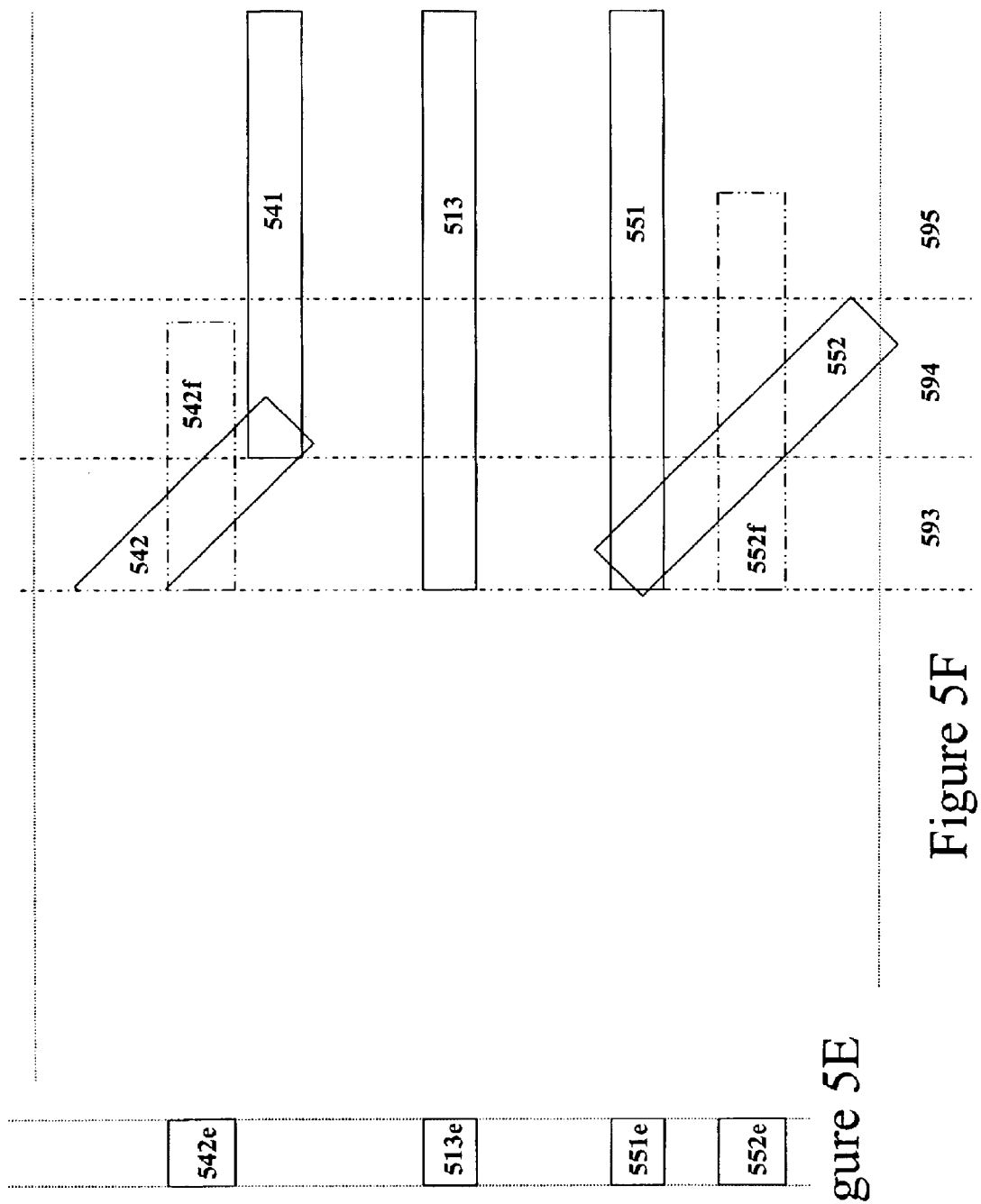
FIG. 5E illustrates a side view of the approximated profile for section 593 of FIG. 5F.
FIG. 5F illustrates the capacitance effect problem of FIG. 5A with interconnect line 542 rotated to create approximated interconnect line 552f and interconnect line 552 rotated to create approximated interconnect line 552f to approximate section 593.
Figures 5G, 5H:
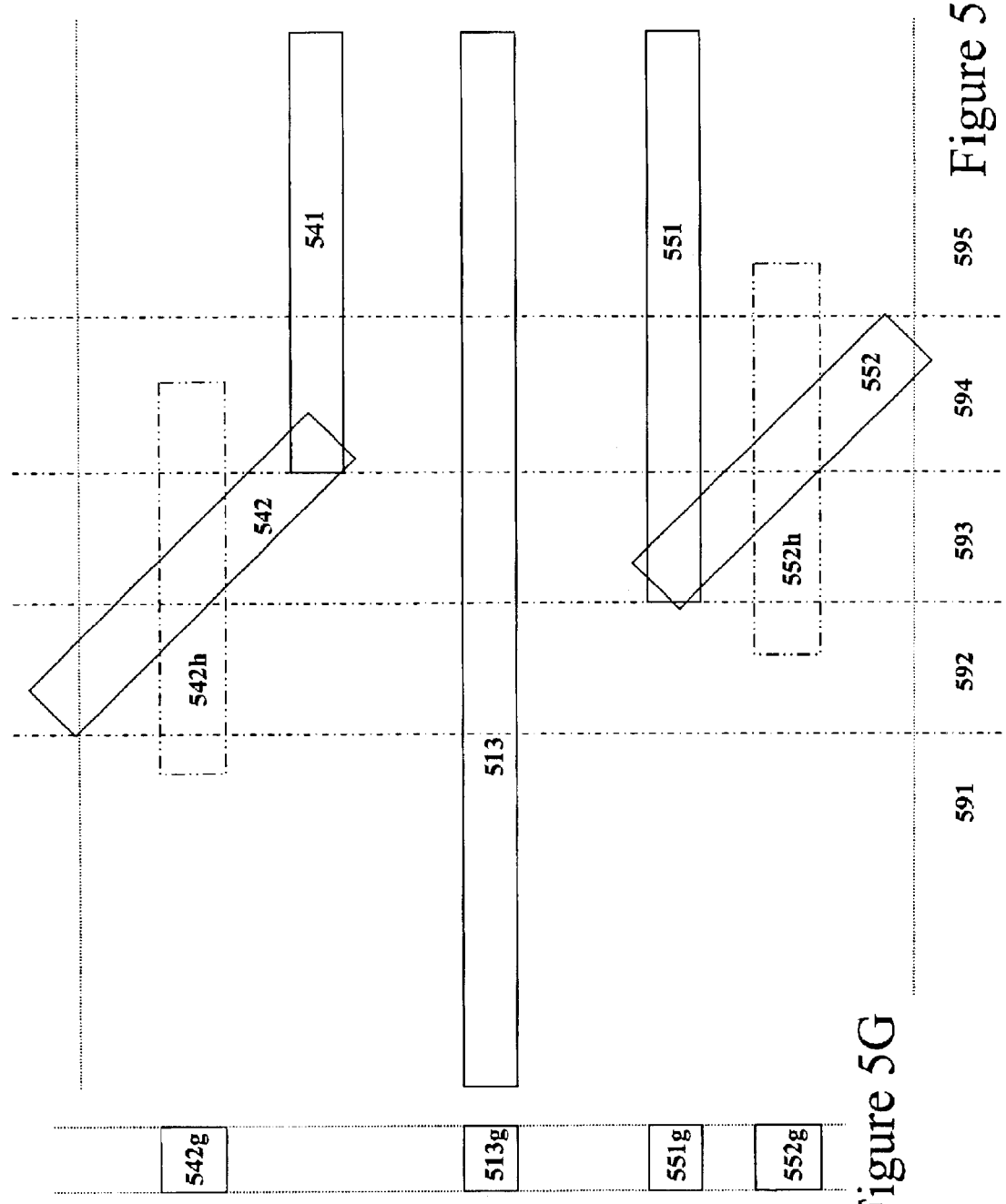
FIG. 5G illustrates a side view of the approximated profile for section 593 of FIG. 5H.
FIG. 5H illustrates the capacitance effect problem of FIG. 5A with interconnect line 542 rotated to create approximated interconnect line 552h and interconnect line 552 rotated to create approximated interconnect line 552h to approximate section 593.

There are different implementations for approximating the non orthogonal sections with orthogonal sections. FIGS. 5F and 5H illustrate two different possible methods of creating an approximated orthogonal profile for section 593. In the implementation of FIG. 5F everything from the previous sections is ignored. Thus, interconnect line 542 has been truncated in FIG. 5F. The non orthogonal interconnect lines are then rotated about their current centers such that approximated interconnect wires 542f and 552f are created for real interconnect wires 542 and 552, respectively. FIG. 5E illustrates the two-dimensional side view profile created by the approximated orthogonal section of FIG. 5F. In the implementation of FIG. 5H all non orthogonal wire segments within the capacitance effect halo are rotated about their center including portions of the wire segment from previous sections. Thus, real interconnect wires 542 and 552 are rotated to create approximated interconnect wires 542h and 552h as illustrated in FIG. 5h. Since the rotation of real interconnect wire 542 includes portions of the wire from earlier sections, the rotation in FIG. 5H places the approximated interconnect wire 542h in a slightly different location than approximated interconnect wire 542f of FIG. 5F. This can be seen by comparing the different two-dimensional profile side views of FIGS. 5F and 5H in FIGS. 5E and 5G, respectively.

Figure 8:
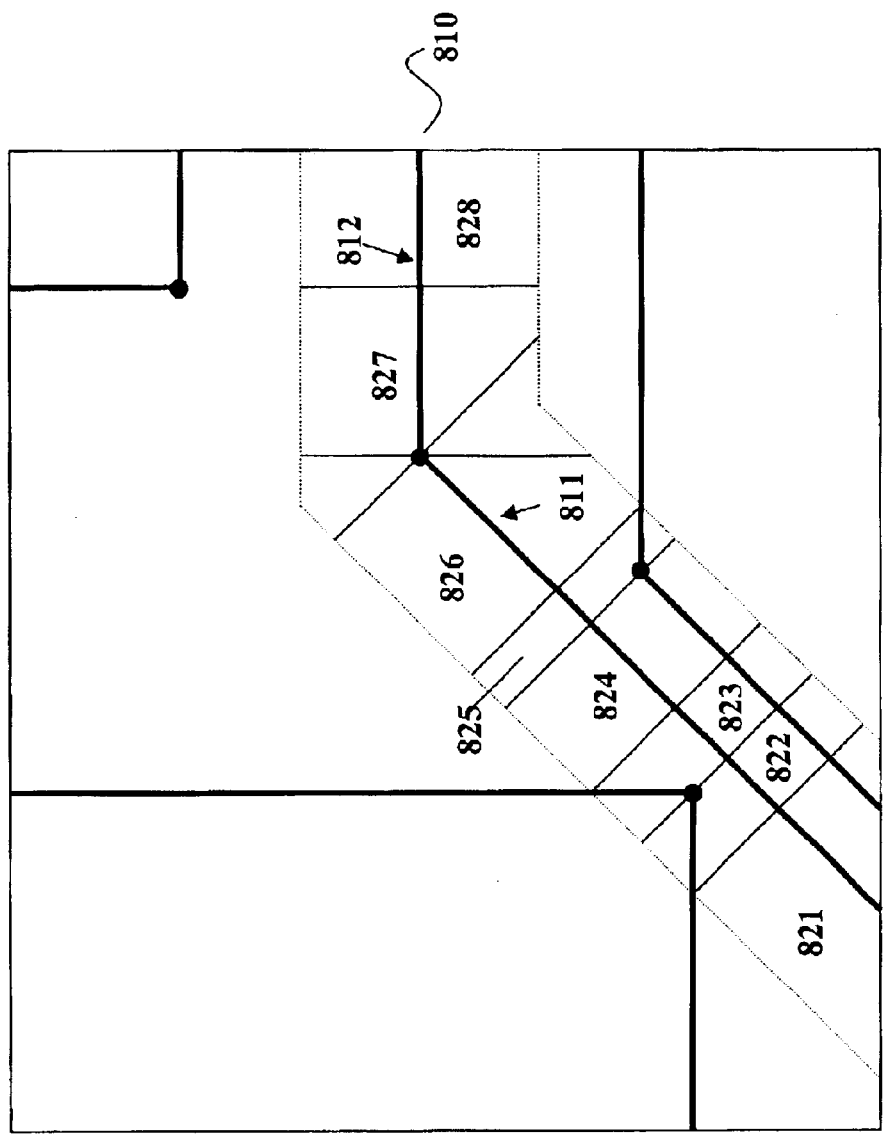
FIG. 8 illustrates a section of non Manhattan interconnect wiring for an integrated circuit.

In a preferred embodiment, the system of the present invention follows an net along its path by rotating the coordinate system such that the coordinate system aligns with the interconnect wire. For example, FIG. 8 illustrates a net 810 that needs its capacitance extracted. The system of the present invention follows net 810 up along its diagonal section with individual sections 821 though 826. As the system proceeds up diagonally, the coordinate system is rotated such that diagonal interconnect wire segment 811 aligns with the coordinate system The system of the present invention then follows net 810 along its horizontal segment 812 with sections 827 and 828. Thus, when analyzing an aggressor net that has diagonal segments, four different scans must be made: horizontal, vertical, a first diagonal direction, and a section diagonal direction orthogonal to the first diagonal direction.

The foregoing has described methods arrangement for extracting capacitance in integrated circuits having non Manhattan wiring. It is contemplated that changes and modifications may be made by one of ordinary skill in the art, to the materials and arrangements of elements of the present invention without departing from the scope of the invention.

We claim:

1. A method of extracting capacitance from an integrated circuit design, said method comprising:
   defining a capacitance effect area around a first interconnect wire;
   approximating a section of interconnect wiring in said capacitance effect area containing a second interconnect wire that is not orthogonal to said first interconnect wire as a section of interconnect wiring containing a third interconnect wire that is orthogonal to said first interconnect wire; and
   determining an approximated capacitance effect of said third interconnect wire on said first interconnect wire.

2. The method as claimed in claim 1 wherein said second interconnect wire lies at an angle of between thirty and sixty degrees relative to said first interconnect wire.

3. The method as claimed in claim 1 wherein said third interconnect wire comprises said second interconnect wire rotated into a direction orthogonal to said first interconnect wire.

4. The method as claimed in claim 3 wherein said second interconnect wire is rotated about a center of said second interconnect wire.

5. The method as claimed in claim 3 wherein said second interconnect wire is rotated about a center of said second interconnect wire after removing a subsection of said second interconnect wire that resides in a previous wiring section.

6. The method of extracting capacitance from an integrated circuit design as set forth in claim 1, said method further comprising:
   adding a correction factor to said approximated capacitance to generate a modeled capacitance effect of said second interconnect wire on said first interconnect wire.

7. The method as claimed in claim 6 wherein said correction factor comprises a capacitance difference between said section of first interconnect wire and said section of third interconnect wire.

8. An apparatus for extracting capacitance for a first interconnect wire in an integrated circuit design, said apparatus comprising:
   means for dividing said first interconnect wire into sections, said sections comprising orthogonal wiring sections and non orthogonal wiring sections;
   means for determining a capacitance of each orthogonal wiring section; and
   means for determining a capacitance of each non orthogonal wiring section comprising
      means for approximating a non orthogonal wiring section with a closely matching orthogonal wiring section,
      determining an approximated capacitance of said non orthogonal wiring section by using a capacitance of said closely matching orthogonal wiring section, and
      adding a correction factor to said approximated capacitance of said non orthogonal wiring section.

9. The apparatus as claimed in claim 8 wherein said non orthogonal wiring section comprises a second interconnect wire that lies at an angle of between thirty and sixty degrees relative to said first interconnect wire.

10. The apparatus as claimed in claim 8 wherein said correction factor comprises a capacitance difference between said non orthogonal wiring section and said closely matching orthogonal wiring section.

11. The apparatus as claimed in claim 8 wherein said closely matching orthogonal wiring section comprises said non orthogonal wiring section with at least one interconnect wire rotated into a direction orthogonal to said first interconnect wire.

12. The apparatus as claimed in claim 11 wherein said at least one interconnect wire is rotated about a center.

13. The apparatus as claimed in claim 11 wherein said at least one interconnect wire is rotated about a center of said at least one interconnect wire after removing a subsection of said at least one interconnect wire that resides in a previous wiring section.

14. An apparatus for extracting capacitance from an integrated circuit design, said apparatus comprising:
   means for defining a capacitance effect area around a first interconnect wire;
   means for approximating a section of interconnect wiring in said capacitance effect area containing a second interconnect wire that is not orthogonal to said first interconnect wire as a section of interconnect wiring containing a third interconnect wire that is orthogonal to said first interconnect wire; and
   means for determining an approximated capacitance effect of said third interconnect wire on said first interconnect wire.

15. The apparatus for extracting capacitance from an integrated circuit design as set forth in claim 14, said apparatus further comprising:
   means for adding a correction factor to said approximated capacitance to generate a modeled capacitance effect of said second interconnect wire on said first interconnect wire.

16. The apparatus as claimed in claim 15 wherein said correction factor comprises a capacitance difference between said section of first interconnect wire and said section of third interconnect wire.

17. The apparatus as claimed in claim 14 wherein said second interconnect wire lies at an angle of between thirty and sixty degrees relative to said first interconnect wire.

18. The apparatus as claimed in claim 14 wherein said third interconnect wire comprises said second interconnect wire rotated into a direction orthogonal to said first interconnect wire.

19. The apparatus as claimed in claim 18 wherein said second interconnect wire is rotated about a center of said second interconnect wire.

* * * * *